(12) United States Patent
Ireland

(10) Patent No.: US 7,164,368 B1
(45) Date of Patent: Jan. 16, 2007

(54) MULTI-CHANNEL PROPORTIONAL USER INTERFACE FOR PHYSICAL CONTROL APPLICATIONS

(75) Inventor: Anthony John Ireland, Norcross, GA (US)

(73) Assignee: Anthony J. Ireland, Nocross, GA (US)

( * ) Notice: Subject to any disclaimer, the term of this patent is extended or adjusted under 35 U.S.C. 154(b) by 403 days.

(21) Appl. No.: 10/724,550

(22) Filed: Nov. 28, 2003

Related U.S. Application Data

(63) Continuation-in-part of application No. 09/850,385, filed on May 7, 2001, now Pat. No. 6,747,579.

(51) Int. Cl.
*H03M 11/00* (2006.01)

(52) U.S. Cl. .......................... 341/34; 341/20; 307/125; 246/187 A; 246/167 R

(58) Field of Classification Search .................. 341/20, 341/27, 34; 307/125; 246/187 A, 167 R
See application file for complete search history.

(56) References Cited

U.S. PATENT DOCUMENTS

| | | | | |
|---|---|---|---|---|
| 6,281,606 | B1* | 8/2001 | Westlake | 307/125 |
| 6,441,570 | B1* | 8/2002 | Grubba et al. | 318/3 |
| 6,457,681 | B1* | 10/2002 | Wolf et al. | 246/187 A |
| 6,619,594 | B1* | 9/2003 | Wolf et al. | 246/187 A |
| 6,624,537 | B1* | 9/2003 | Westlake | 307/125 |
| 6,655,641 | B1* | 12/2003 | Sherman et al. | 248/58 |
| 2003/0142796 | A1* | 7/2003 | Ames | 379/88.04 |
| 2004/0079841 | A1* | 4/2004 | Wolf et al. | 246/167 R |
| 2004/0239268 | A1* | 12/2004 | Grubba | 318/268 |
| 2005/0023416 | A1* | 2/2005 | Wolf et al. | 246/167 R |

OTHER PUBLICATIONS

DIGITRAX/Z. Ireland, "The DIGITRAX Big Book Of DCC" Book, ISBN #0-9679830-0-X, Pub Dec. 1999, 175 pages, Publ. USA.
N. Besougloff "Command Control For Toy Trains", ISBN 0-89778-523-1 Publ. Oct. 2003, Kalmbach WI. Copy Title Pages & pp. 92/93.
NMRA/Dietz "Serial Use Standard Interface" Publ. May 2003. as TI-9.2.3 , 8 pages.
Ireland/Digitrax "Digitrax PCC Transponding Encoding" Publ. Jun. 1999/Feb. 2000 , 7 pages.
Digitrax Inc. "Digitrax Aug. 1999 Product Catalog" Publ. Aug. 1999, 63 pages.

* cited by examiner

*Primary Examiner*—Albert K. Wong

(57) ABSTRACT

New techniques are presented for providing proportional activation of model railroad functions and effects with control keys on a model railroad layout control system. This permits for example a throttle device connected to a digital layout control system to provide for a "playable" or variable-pitch whistle sound effect where prior art was severely limited in providing this effect realistically. This invention allows proportional keys with the added ability to control multiple aspects of any effect and to latch proportional values at any state. This invention also allows the expansion of the wireless and Internet connection capabilities of the network of a layout control system so the new proportional capabilities can be carried across these connections.

47 Claims, 5 Drawing Sheets

MULTI-CHANNEL PROPORTIONAL USER INTERFACE FOR PHYSICAL CONTROL APPLICATIONS

Figure 1:
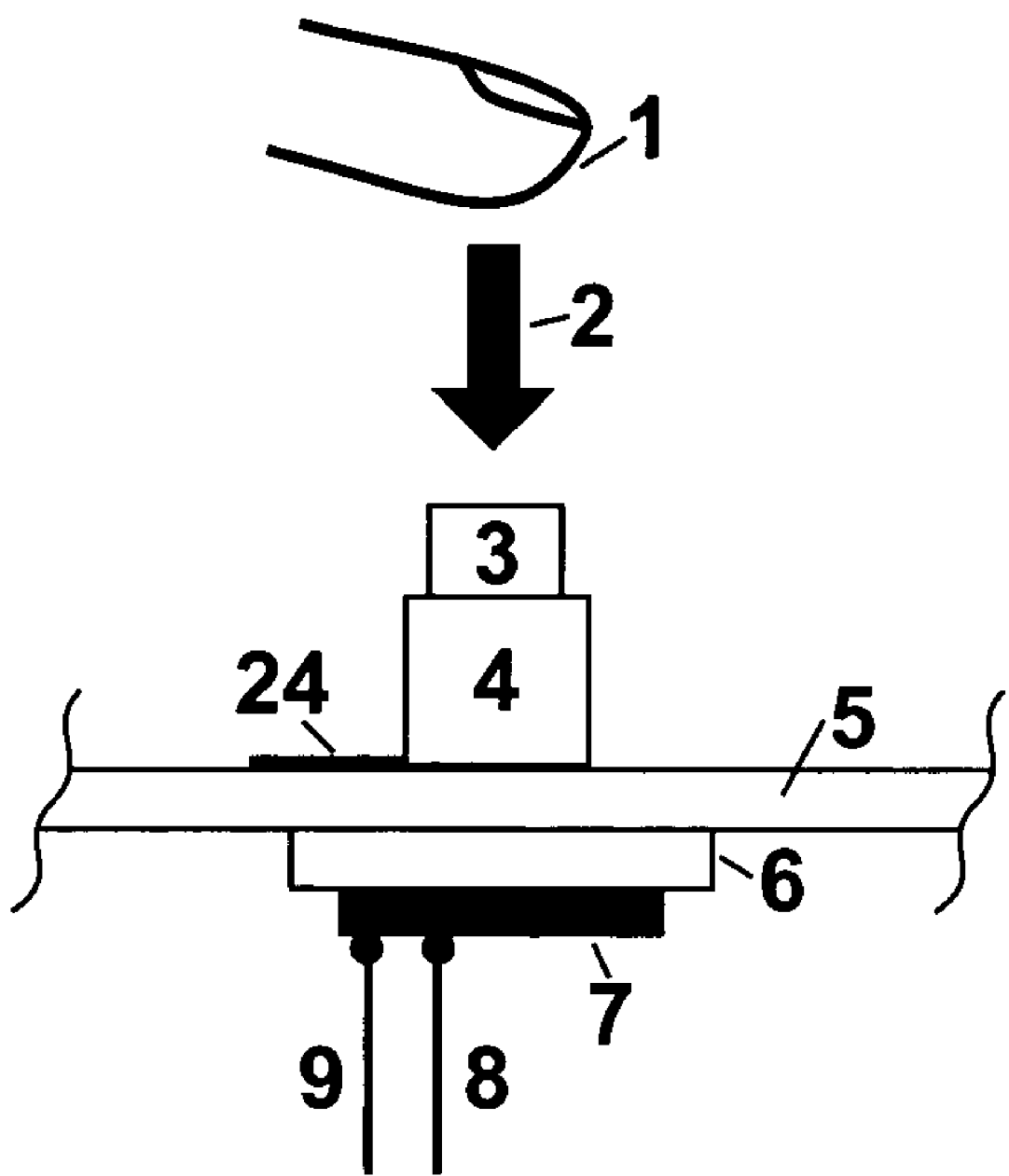

This application is a Continuation In Part of application Ser. No. 09/850,385 filed May 7, 2001, now U.S. Pat. No. 6,747,579.

BACKGROUND OF INVENTION

This invention pertains to the field of control systems of physical events that are to be proportionally controlled by a user via a user interface. Examples of this capability would be for; manual control of a robotic arm, control of icon or sprite on a computer game graphics display and scale model railroad layouts to improve the control of whistle and other sound effect generation or function capabilities.

The following discussion summarizes the rapidly expanding art of model railroad control systems and shows how many diverse elements affect the reduction to practice of adding a proportional capability to a model railroad layout control system.

The era of prototype (full-size) steam-powered locomotives carrying significant railroad tonnages has passed, but nostalgic model railroaders enjoy the sounds of "live steam" on model railroad layouts. In addition to steam "chuff" sounds of moving steam locomotives, bell and steam whistle effects are particularly favored by modelers.

A steam powered locomotive whistle is very distinctive, and many new innovations in model railroad sound systems strive to provide realistic and controllable whistles on scale model railroad layouts. Examples of this would be modern DCC controlled sound decoders from Soundtraxx Inc. of Durango CO and ESU Electronics GmbH of Ulm Germany.

On non-digital or conventional analog DC controlled model railroads, the Pacific Fast Mail or PFM sound system has been very popular since the 1980's and creates very realistic sound images that are synchronized to the motion of the model locomotives, particularly narrow-gauge models. A favorite PFM sound effect is a "playable" or variable pitch steam whistle, which recreates the action of a prototype engineer varying the whistle steam valve to modulate the steam whistle pitch, harmonics and intensity. This provides a lot of realistic "character" to the operation of a model locomotive. The PFM system creates the playable whistle with a hand operable pivoting whistle pitch control lever on the control unit. In the rest position this whistle pitch control lever ensures that no whistle sound is generated. As the lever is actuated and its angle is changed the whistle sound effect is generated and is modified in pitch proportionally to the lever angle. Thus moving the lever up and down allows the generation of a controllable, continuously variable and playable whistle.

In the PFM design, the sounds created in this manner are conducted from the control unit via the layout rails to a speaker mounted in the locomotive, and optionally to speakers mounted around the layout. This arrangement permits a single high quality sound system for one train on the rails connected to a single control unit. Several other sound control units exist, for example units from Model Rectifier Corporation and Chicago International that employ slider controls to allow a modeler to create a playable whistle on a conventional DC model railroad layout.

To date the only variable pitch whistle effects that have been introduced into digitally controlled model railroads are within the Marklin GmbH 1-Guage sound units on layouts controlled by their Trinary square-wave digital control system. In this system a binary state accessory function control key associated with whistle control is depressed on the control unit, or throttle, that activates the whistle in the digital sound generator in the model locomotive, and is also used to indirectly control a variable whistle pitch. After the locomotive whistle is activated by the whistle function key depression, the whistle pitch begins to change in the digital sound generator in a manner controlled in proportion to the time the key is depressed. This provides a controllable whistle pitch with the standard Marklin binary function state control system components, but lacks the impression of continuously variable pitch that a lever or slider control creates. This Marklin control method, since it is a digital control system, has the desirable advantage that it permits the realistic operation of a multiplicity of whistle equipped digital locomotives in the same area of layout tracks.

Note that the prior art attempts some types of sound varying control by employing binary (on/off) or other inconvenient or unrealistic user interfaces. For example, Wolf in U.S. Pat. No. 6,457,681 teaches a "Doppler" sound simulation that may be initiated by the user, but this is limited by the fact that the Doppler pitch and amplitude changes of Wolf are (for a given train speed) predetermined for both up and down changes, and thus are less than realistic. This is not a true proportional effect under direct user control.

In this manner the prior art provides playable whistle effects or other modifiable sound, but with limitations in all the implementations.

Computer input devices have been developed to a fine art with examples such as Parsons in U.S. Pat. No. 5,286,089 and Ono et al. U.S. Pat. No. 5,555,004. All this work is aimed at providing force sensitive computer input pointing devices that are fully integrated as a device that is manufactured as a single assembly. These mechanisms are not designed as an adjunct or upgrade to add capabilities to an existing conventional key array structure. The implied or derived force measurement is used to provide X and Y position or a selection click or double-click as a user input, and is not localized to attaching extra sense capability to any single key in a key array.

An example of the use of this invention with a model railroad layout is the provision of proportional commands from a manual user input device (throttle) that communicates with a digital layout control system connected to a model railroad layout and ultimately to a decoder that makes use of these proportional commands to control sound generation or other features that can benefit from proportional commands.

The commanding of a desired train speed is specifically defined and stated as not being a proportional effect within the meaning of "proportional" used in this disclosure, since the speed of the trains have been commanded by control inputs since the first electric trains were produced over 100 years ago, and is a different effect or aspect than is described in this invention. Note that users and even specifications often interchange the terms locomotive and train. Typically a train comprises a locomotive and other rolling stock as a unit for railroad scheduling and routing. This specification may use either terms to be consistent with prior art, and by context it should be clear that a referral to "train" is to a locomotive with or without extra rolling stock, and that in many cases an internal decoder device is installed. Decoder devices may also be usefully employed for control in rolling stock other than powered locomotives and even connected to the rails in a stationary configuration.

Prior art such as Wolf, U.S. Pat. No. 6,457,681, is an example of a layout control system that allows control of model trains with sound and other capabilities that have some similarities to this invention. However, this technology taught by Wolf is not state of the art, and is surpassed with the configurations disclosed herein.

Wolf teaches a track control signal that "injects", adds or modulates a controlling RF baseband direct sequence spread spectrum signal upon an AC (or DC) power signal. This is an architectural constraint to allow the use of a mixture of "conventional" or legacy trains (that are not modified to take advantage of increased control features) alongside newer digital trains. The conventional power signal that these "legacy" locomotives normally respond to is typically a transformer controlled variable-AC voltage that is detailed well by Severson in U.S. Pat. No. 4,914,431. The locomotives that can use this AC voltage to operate are typically 3-rail O-scale trains made by Lionel, Marx, K-Line, etc. This O-scale train market segment is often referred to as the "Toy Train" market as distinct from the "Scale model" railroad market where a 3-rail track is not considered to be visually prototypical.

By contrast, a large number of scale model railroaders in the US employ 2-rail DC controlled trains in HO and N scales, such as those made by Athearn, Kato and others. For this majority of modelers, the natural modern control choice (that still allows legacy train operation) is based on the well-known National Model Railroad Association (NMRA) standard for Digital Command Control (DCC). The NMRA open standard for DCC has been in wide use since the mid-1990's and uses a track drive signal that is a saturated-level digital bipolar square-wave waveform based on a packet technology, which is a distinctly different and superior technology to Wolf for this type of application.

Wolf is limited in the forms of modulation he can claim injected into a power signal, because of his citation of the 1980 Keith Gutierrez CTC-16 art that also injects a control modulation onto a power signal, in this case a modulation impressed onto DC power. In the 1990's Gutierrez subsequently upgraded the CTC-16 to CTC-2000 that employs a digital signal added to a DC power signal.

The large HO and N scale market segment cannot be addressed by the Wolf '681 art because the provision of the Analog Zero Stretching Method for NMRA DCC that allows legacy control of DC trains mixed with digital trains [detailed in section 13.3 of the book "Digitrax Big Book of DCC"—ISBN#0-9674830-0-X, published 1999, and entered herein as additional reference for layout control prior art] is not addressed or taught by Wolf as within the scope of his art, and additionally, is not compatible with legacy operation of 3-rail AC O-scale trains.

Impressing or injecting an RF spread spectrum control signal with variable DC power for control of a DC conventional train, does not allow for a stationary DC conventional train to create sound, light effects and even smoke, as would be needed to provide a realistic model when stopped a at train station or yard. DC 2-rail modelers demand this capability, which Wolf does not teach or provide for.

The DCC signal is superior to Wolf's signal because it encodes commands in the full track amplitude waveform excursions, and is easily filtered and protected from any practical system noise and track configuration disturbances and permits a mixture of unmodified (legacy) and digital trains to operate on the same tracks. DCC has been used successfully for control of trains in all model scales, from Z-scale to Guage-1.

Wolf's injection of a modulated RF signal on a power signal invites problem of signal propagation and signal strength on the rails, even if a modicum of noise rejection is conferred by direct sequence spread spectrum technology. Neil Besoughloff in the book "Command Control for Toy Trains" page 93, (ISBN# 0-89778-523-1) details these problems the Wolf technology has on real layouts. The RF signal strength problem is reportedly so bad on some layouts that users must add lamps or other "transmission line impedance termination" patches to try and ensure stable and reliable operation.

By contrast, on DCC layouts if there is sufficient signal to allow a train to move, a decoder (designed by one skilled in the art of DCC and train control technology) is guaranteed to remain under positive control. Note that, unlike DCC, Wolf's controlling modulated RF signal without an additional power signal is inoperative and not of sufficient power to move the trains. If this RF signal were increased to be sufficiently energetic to operate a train (in range of about 12 to 100 watts), because of the antenna effects of the track wiring and rails, it would then have to be licensed by the FCC as an intentional RF radiator or transmitter and would then have; health, shock and burn hazard consequences on open rails, and would likely be impossibly restricted in allowable carrier or emission frequencies.

A DCC or any other known digital bipolar square-wave type of digital control signal such as; Marklin Trinary, Trix, FMZ and Zimo, is indivisible from the layout energization means, and is not simply a RF control signal riding "piggyback" on a power signal or source.

The direct sequence spread spectrum modulation RF control signal taught by Wolf is significantly more complex to synchronize, correlate and decode within the recipient decoder device, when compared to DCC. This means a higher cost, power consumption and larger size for a decoder when comparing equivalent levels of implementation technologies, which is contrary to the expectations and wishes of the market and consumers.

Another limitation of the Wolf '681 art is the method by which system components are interconnected and the system is expanded.

Prior art taught by Ireland in U.S. Pat. No. 6,275,739, incorporated herein by reference, shows the benefit of all system elements being interconnected in discipline via a bi-directional multiple-access data network. This Ireland prior art specifically teaches a throttle device that is connected bi-directionally to a layout control system. This throttle may also be a remote or un-tethered throttle, and gain access by a radio/RF or infra-red communication link that supports this bi-directional multiple-access data network capability. [item 16 FIGS. 1 and 2, and lines 37–40 col 1 and lines 39–41 of col 3 of Ireland '739]. Of great importance for a system using a bi-directional multiple-access data network is that the data flows are not mediated centrally by a single device such as a Command Station, Track Interface Unit or equivalent central control means. With this method, all elements or devices on the network enjoy the freedom of being involved in any type of data transfer, in any direction, by simply following; the network access rules, grammar and control capability incorporated in that device. The ease of expandability and interconnect taught in U.S. Pat. No. 6,275,739 is thus both a prior art and a distinct advance over the art of Wolf '681.

Dunsmuir, in U.S. Pat. No. 5,638,522, and Katzer, in U.S. Pat. No. 6,065,406 also teach the addition of computer(s) to allow automated operations by detection and controlling the layout and expanding the way multiple interfaces may be added to model railroad layouts, and are additional prior art distinct from U.S. Pat. No. 6,275,739. Dunsmuir shows a hierarchical design that employs a Token ring network interconnection for most control elements, but that is based on the supremacy of a single master/slave PC with a complex graphical user interface to animate most layout capabilities. Master/slave architecture compromises system growth choices and scalability.

All these PC control applications, including for example "Timetable" capability in the Winlok 2.1 software by Digi-toys Systems Inc. and the "flagman" in the RailRoad and Co. software, show examples that allow the user to pre-configure or record a complex sequence of layout actions and train commands, that can be modified by layout detection, to expand layout control. These permit, but are not limited to; the automation of routes (a sequence of turnout activations), the stopping of trains on signal/occupancy state, interlocking the safe movement of trains, the display of locations of trains and the announcement or triggering of a sound file when a train has reached a location. These capabilities are well documented in the "Digitrax Big Book of DCC", including section 11 which teaches a large PUTRA automated DCC training layout in Kuala Lumpur, Malaysia that was in operation before 1999. The Digitrax LocoNet used in the PUTRA simulator model layout allows the convenience of multiple PC's running the Winlok 2.1 software to be connected simultaneously to provide multiple terminals and also diagnostic capability.

A bi-directional or "Transponding" data connection to a decoder device taught by Ireland in U.S. Pat. No. 6,220,552, incorporated herein by reference, teaches and allows the real time dynamic tracking of locations of multiple trains and decoder devices on the layout, and the interrogation of data that is decoder device state information such as; measured distance traveled, control input states (e.g. if a load is situated on a boxcar or a pantograph is down, a turnout is closed, etc.), train speed, motor load/current draw and speed compensation amount, and any other manufacturer specific and configurable data or program information such as NMRA Configuration Variable (CV) settings and status reports, error conditions or downloaded sound fragments that may be employed by the decoder devices to generate sounds around the layout. A decoder device may be mobile or stationary within the layout control system and can be connected via an expansion device, signal repeater or booster. The detection system is then configured to receive the response signal from the decoder device, and this in combination with encoded track commands addressed to the decoder device, clearly forms a bi-directional data link, and flow.

Ames, in U.S. Pat. No. 6,539,292, claims the ability for a system to modify its control based on the detected location of a decoder device. The Ames' '292 specification clearly shows [lines 34–37 col 4] that the Ireland '552 art meets his description and can be described as equivalent to his "bi-directional communication".

Ames states incorrectly that Ireland '552" . . . can only acknowledge a specific command sent to it and cannot initiate a communication on its own." [lines 21–26 col 3]. This is contradicted by the specification of Ireland '552, and claim 7, that clearly is for a device that can respond when not interrogated by its own address, and is hence not limited by the rate it is explicitly addressed. A number of other clearly false statements and conclusions are stated by Ames. For example, Ames misstates the Ireland 552 prior art by stating: "The Digitrax approach, like the Zimo approach, both suffer from the command refresh rate." [lines 30–31 col 3 of Ames '292].

Ireland '552 explicitly teaches [lines 19–23 of col 21] that the decoder responses (that clearly meet Ames' definition of bi-directional capability) have the benefit of being " . . . not limited by the rate commands are sent to any single address." This Ireland prior art teaches a device that can initiate a response without being constrained by the system.

Unfortunately the Ames' specification, by redefining or labeling a decoder response to a command as "bi-directional" and stating many false limitations of the Ireland '552 prior art, misleads the examiner in a matter that is fundamentally at the heart of Ames' claims for novelty over the prior art of bi-directional data communication and control.

Wolf '681 fails to anticipate or teach the ability of his invention to identify the address and then to use this to track train position as it moves around the layout. This tracking (e.g. 'Transponding') is definitively a form of bi-directional data feedback and acknowledgement. Wolf '681 only mentions contact switches or IR position sensors for location detection, and does not teach expanded detection of occupancy or position feedback by utilizing the conducted track voltage or current waveforms, or how this expanded detection and position information then may be employed to automate or advance the control capability of the layout by any connected control element. Marklin and others have employed as prior art; contact switches, IR or laser reflective/transmissive sensors, optical Bar codes, magnetic detectors and RF identification to provide detection for control and display purposes. The use of visual pattern recognition to identify and detect rolling stock has also been discussed, and color-coded swatches have been tried by the prototype railroads for visual detection and control.

The Ireland '552 prior art teaches and anticipates a wide diversity of data exchange and bi-directional capability with decoders connected to the layout, including the ability to detect and alert train derailment or removal from the layout and system so the system can respond and modify its behavior. Section 10.0 of "The Big Book of DCC" clearly teaches many examples of the layout control system adapting its behavior to train location feedback, and even shows an example of the system making a decision to run the train around a reverse loop if needed after recognizing the bi-directional data feedback of a transponding device address.

At the 1993 NMRA National Train Show and Convention in Valley Forge Pa., the MiniTrix control system (from the Trix company of Germany) was demonstrated with miniature ceramic board decoders in HO and N scale that employed a Digital square-wave track control signal and a back-emf motor speed control with fine speed resolution and speed/load compensation. At this time, and up to 1998, several other companies such as Marklin, Zimo, Lenz and Arnold also demonstrated digital decoders with back-emf speed/load compensation. The Umelec Company of Switzerland also demonstrated a version of speed/load compensating digital decoder with an optical sensor on the motor flywheel to provide speed/load compensation, as an alternate to sensing motor speed by back-emf. All these prior art decoders employed a control strategy such as the well known Proportional Integral Derivative (PID) servo control loop method. This allows the decoder to compensate for the slowing down or speeding up of the motor in response to a change in load (i.e. the "droop" or speed/load sensitivity), and thus tend to hold any constant speed commanded by a user. Severson in U.S. Pat. No. 5,448,142 teaches some of the control possibilities for employing the back-emf detected from a motor on a model train, such as laboring of sounds when an increased motor load is detected, etc.

From August 1999, Digitrax Inc. was shipping the DZ121, DH140U and HAG501 decoders that had back-emf load compensation called "Scalable Speed Stabilization"

(denoted as 'SS' capability in August 1999 Digitrax catalog, p38/39), and having 128-step resolution. This allowed scalability, such that the user could adjust the "droop" or speed/load compensation characteristics on the fly. This allowed the Intensity or droop CV (CV57) of the back-emf PID type loop to be dynamically programmed in operation, such that the droop amount (or speed/load curve sensitivity) could be changed to suit the model and power characteristics needed. For example, a minimum droop CV57 of zero means that the back-emf load compensation is turned off and the model behaves like an unmodified DC motor locomotive, and this is similar to the performance of most US prototype diesel locomotives. Conversely maximum droop CV57 setting ensures the most constant train speed, irrespective of the train length and load and whether the train is on a up, down or flat grade. In between settings of droop CV57 allow a proportionate compensation effect. The CV57 droop adjustment is a new and separate coefficient within the speed control algorithm distinct from the three Proportional, Integral and Differential coefficients of a classic PID loop and conveniently interacts with all 3 PID terms separately.

Most early US diesel prototypes, with the exception of the SD9, did not have load compensation from the wheel speed to the prime-mover engine and generator. By contrast many European prototype diesel locomotives employ a drive scheme that speed/load compensates to ensure a more constant track speed to allow for busy track and train schedules. So, with a simple adjustment of CV57 in real time the user can choose the most realistic droop for the model to use at that time.

For US modelers with large consists of multiple engines there is another advantage to modifying the droop CV. Here it is desirable to lower the droop CV value in the locomotives, otherwise any differences in speed or compensation accuracy between the locomotive decoders will generate large coupler forces between the locomotives (the "pushy-pusher" effect) and can contribute to derailments. This is such a useful feature that there is an additional consist droop CV in Digitrax back-emf decoders available to automatically invoke this change when the decoder is consisted.

With the scalable 128 step resolution back-emf decoder capability, Digitrax users intrinsically interpret the numeric digital speed display in DT100 (or like throttles or computer based throttles) as showing the train speed in convenient units, typically as miles per hour. The value of speed curve slope CVs can also be easily modified to show the speed in kilometers per hour, as discussed in the "Digitrax Big Book of DCC".

Wolf, in U.S. Pat. No. 6,619,594, fails to be aware of or acknowledge this widely known body of prior art in the industry that directly and publicly contradicts the novelty of his claims.

Novosel et al, in U.S. Pat. No. 5,855,004 teach the benefit of digitally generated sounds in locomotive decoders using an NMRA DCC control signal. This work was actually anticipated and demonstrated in the DSD2408 DCC sound decoder shown publicly by SoundTraxx at the Amherst Train show, 14 months before being added as new matter to the Novosel specification.

In early 1999 ESU GmbH demonstrated a DCC compatible sound decoder that allowed the user to download to the decoder in the locomotive customizable sound fragments and a control sequencing scheme from; a recorded computer wave sound (.wav, etc) file, CD or the Internet via the track. Information can also be uploaded from the decoder and sent off via the Internet for Customer Service use. The operating state changes of the ESU decoder allowed the user to custom configure these looped sound fragments for steam chuffs (or diesel prime mover) when the decoder changes from accelerating under load, running steadily and decelerating with lighter load. For diesels, the prime mover pitch and volume are modulated based on throttle demand, and unique startup and shutdown sounds are also part of the sound-sequencing scheme. Note that the ESU decoder allows the decoder setup to be modified or downloaded into flash or EEPROM memory even when the train is running on the layout. The multi-format Uhlenbrock "Intellibox" was introduced in 1998 which allowed the DCC, Marklin Trinary and Trix formats to be interspersed on the track. This unit also allows the operating software to be downloaded and updated via an Internet connection to the Uhlenbrock website.

SoundTraxx Inc., ESU Electronics, Novosel '004 and Wolf '594 prior art only teach integrated motor, function and sound decoders in one combined module.

In 2003 the Dietz Company of Germany offered the NMRA a specification for a Serial User Standard Interface (SUSI) method that allows a sound generator to be hooked to a decoder with a synchronous data link employing a clock wire, data wire, a power wire for DC power supplied by decoder, and ground wire that connects via a 4 pin 1 mm pitch connector. However, this interface does not implement a proportional command interface and is not configured to allow the sound generator to decode commands directly from the track. Additionally the clock and data wires are dedicated to the synchronous data link and are not operable as separate general-purpose function control lines.

Severson '142 teaches the modification of sound based on back-emf load. Wolf U.S. Pat. No. 6,619,594 discusses storage of different chuff sounds based on load, but does not claim this capability. Novosel U.S. Pat. No. 5,855,004 claims storage of sounds at different workloads. All these prior arts fail to address the reality that the steam chuffs undergo a continuous change when trainloads vary and not, say for example, a series of 3 or more pre-recorded sound examples.

For several years the NMRA DCC Working group has been informally contemplating a SoundTraxx Inc. request for an Analog Control instruction for the track that is usable for a part of a NMRA DCC compatible version of this invention, but this has not been taught in a complete functional form and reduced to practice.

Since the mid 1990's the LocoLink products from Lake Oswego OR have shown the ability of RF remote throttles to directly control a decoder in a locomotive, without the need for external track control signals. The Digitrax and Zimo systems, before 1998, demonstrate remote throttles that can operate DCC type control systems by Radio Frequency and/or Infra Red signals. The RF systems to date have been of a fixed or a limited number of discrete frequencies, and this poses limits to the number of throttles and layouts that can operate at e.g. a Train Show. The Digitrax RF data link employs a 900 MHz band FM modulation scheme that uses Time Division Multiplex messaging methods.

Wolf '681 employs an RF (intentionally radiated) radio link (as opposed to his additional RF spread-spectrum signal conducted via rails to the trains) between the remote control and TIU unit. Here Wolf uses a simple 900 MHz band OOK keying (100% AM modulation) method to create this radio link, but fails to teach the need for, or benefits of, other radio link architectures that overcome the problems both this OOK modulation scheme and RF data link design have with interference, multiple proximate users, or any channel management issues.

The improvements over the prior art used in this invention, and in combination, allow a greater level of realism and capability for model railroad layouts with a increased flexibility and lower cost.

SUMMARY OF INVENTION

For model layouts using digital control systems the fundamental problem for allowing realistic playable whistle effect or any other sound modification is that the user input or control devices such as throttles have all been designed for binary state or on-off actuation of accessory function and sound devices on the layout. Prior art digital control designs have made no provision for throttles to have proportional actuation of accessory function controls, excepting that rotary knobs, encoders or slide controls are allocated solely for continuously controllable locomotive speed. It is possible to mount a control lever or slider on a throttle for proportional actuation accessory control, but these require extra space and add extra cost, as they are additional to the standard controls that have been heretofore provided.

Prior art railroad digital control systems associate sound controls with a small array of general-purpose on-off accessory function keys or switches on the input device or throttle. This has been sufficient to date to allow a repertoire of sounds to be turned on or off by the user. For example accessory function keys are individually allocated to simply toggle on or off a bell, coupler clank noise, steam dynamo, steam cylinder blow-down and other discrete effects. This array of accessory function keys for controlling effects needs to be redesigned to permit proportional control input actuation capability. This expands control capability by allowing the user interface to provide realistic dynamic modification of sound generation across a multiplicity of sound effects and channels at the same time, and in real time.

It is an object of this invention to provide the additional new ability for a digital control system to dynamically and proportionally control one or more aspects of individual, or a multiplicity of, sound effects or layout control functions, beyond the prior art non-proportionally controlled variable pitch whistle. New and novel sound features that may now be created and dynamically modified can be based on all of the existing digital sound fragments and individual sound effects such as, but not limited to; steam whistles, air whistles, bells, air horns, coupler clank noise, rail noise, cab noise, steam dynamo, steam cylinder blow-down, Dynamic brake fans, brake squeal, wheel flange screech, smoke stack chuff, diesel idling speed, and ambient sounds like: cities and towns, passenger terminals, freight yards or countryside noises.

It is an object of this invention to overcome the limitations of prior user interfaces on model railroad digital control systems and provide for a more realistic feeling variable whistle control feature. This invention allows existing accessory control key array designs to be upgraded to add proportional Z-axis or force measurement localized or explicitly attached to any existing individual keys. This allows the improved proportional control of any feature controlled by such upgraded accessory control keys. This is of great benefit to expanding the control capability of user interfaces for digitally controlled model railroads.

It is an object of this invention to allow a combination of keys to provide a multiplicity of proportional control aspects that can be latched or frozen at any value. This allows the new proportional control method to be extended to more than one aspect of the sound, for example from the following non-exhaustive set; the pitch envelope, the amplitude envelope, the time base, the duration, ambient sound reflections and the number of repetitions of the sounds, may now be modified singly or in combination. The individual effects, and also combined sounds, may also now have dynamic volume and pitch control. This permits the realistic real-time implementation of the Doppler effect (pitch variation due to relative motion) and the simulation of the sound source fading into the distance, or approaching, by the sound level and varying rate of pitch change. Additional sound qualities that can now be controlled realistically in a proportional manner are; echoes, reverberation from the environment the user attention is currently focused on, and the time sequencing of events and their repetition.

A proportional control actuation key capability may be awkward to implement, and needs to fall within the control format of the overall accessory key array, so that for example, a steam whistle effect function key on one locomotive may be used for some other feature on a different type of locomotive that has no whistle but needs available function controls for other features. It is undesirable to allocate and specially build a non-array key that is only associated with a single type of capability.

The solution to this problem that this invention employs is to add an extra dimension of controllability to the accessory function switch array by allowing a Z-axis or force normal to a function key to be used as an analog or continuous input associated with that key. This means that the pressure exerted by a fingertip on a key may be used to both activate an accessory function and also then be used to vary the same accessory function by applied pressure changes. This provides a variable control input capability while allowing the key to be a standard unit within a standard function key array.

There are a number of everyday items that permit proportional control by a human hand. For example; a computer game joystick, a force sensitive eraser-head pointing device added between keys in a computer keyboard and a force sensitive touch pad computer pointing device. All these common examples differ from this invention in that the proportional force sensing capabilities are specialized devices, and are not used to upgrade a force insensitive general-purpose control switch array to a higher level of control capability.

It is an object of this invention to specifically add Z-axis sensing capability to a key array design without inherent Z-axis sense capability. This may be applied selectively to either a single key or any number of keys in the array. This feature is of value since it permits the selective design upgrade of a standard or inexpensive key array, or array of same types of key devices, to have a new and useful proportional control capability. The addition of proportional control capability is accomplished within the footprint of the key array so outwardly to the human interface there is no need for extra tooling or package design changes to the exterior of the enclosure supporting the keys.

It is an object of this invention is to provide for an enhanced control system capability that allows the reception of a multiplicity new proportional commands and proportionally controlled aspects from a throttle or any other network device, and then translate these commands to new digital layout control instructions that then faithfully communicate these new proportional commands, aspects and capabilities to the final recipient decoder devices.

Thus, it is an object of this invention to allow proportional control of an effect from the user interface through the control system to the final recipient decoder device.

It is an object of this invention to create a proportional command capable layout control system based on a bi-directional multiple-access data network that allows any attached device to: operate, mimic, emulate or masquerade as a manual user input device (throttle). In this way, one PC (or a multiplicity of computers), PDA's or Web Servers can be multiply connected to the layout control system and also establish further connections via a Dialup PPP link, DSL, Cable TV or other type of broadband data connection, such as wireless 802.11 link, to an Intranet or the Internet. Now any attached interconnected device can be involved in any control functions and display that the system is capable of, and can now add further possibilities, including but not limited to; layout automation with dynamic state feedback of train position and state, automated operations with fault detection, tolerance and recovery, mixed automatic and manual operations, exchange of data, and remote monitoring of layout operation and state. A remote device may also be configured to provide an emulated proportional control capability with a number of methods, even if proportional keys are not built in.

It is an object of this invention to enable the new combination of proportional command capable layout control system employing a bi-directional multiple-access data network, and bi-directional data Transponding art that allows any attached device, for example a manual throttle, PC or Internet connected PC, to track or view any of the bi-directional data extracted from a decoder, or a transponding enabled layout device.

The information fed back from decoders via the detection means is not required to be received, decoded or translated by the command station means, but is broadcasted and directly accessible on the network by any "interested device". An example of this Transponding art would be a Digitrax BDL16 LocoNet detector first publicly demonstrated in July 1999, employing the art of U.S. Pat. No. 6,220,552 and discussed in section 5.2 the "Digitrax Big Book of DCC".

It is an object of this invention to employ a frequency-agile RF radio link that has the ability to adapt the RF modulation, data encoding scheme and RF link control method and timing to allow operation with new systems and capabilities, as well as permitting mixed operations and connection with legacy RF links.

It is an object of this invention to employ a frequency-agile RF radio link with frequency hopping arranged to allow a transceiver device to selectively be a member of several different non-interfering RF links in real time.

It is an object of this invention to provide a separate and convenient "plug and play" addition of an external sound generator controlled over a synchronous data link that is formed by the reconfiguration of multiple direct function leads. This synchronous data link is intended and capable of allowing full access to all the features of the external sound generator, including but not limited to; proportionally controlled sound effects, sound effects influenced by motor speed and load conditions, sound event triggered by user commanded function keys, sounds configured by pre-determined events and the download and upload of sound waveform data and configurations from any other device communicating with the layout control system.

It is an object of this invention to provide an expansion of the track waveform control capability to permit more control choices and higher speeds and allow interoperation of decoder devices with differing or incompatible control technologies on these upgraded track signals.

Attached Drawings: (4 Sheets)

FIG. 1 details the typical physical arrangement of the preferred embodiment

Figure 2:
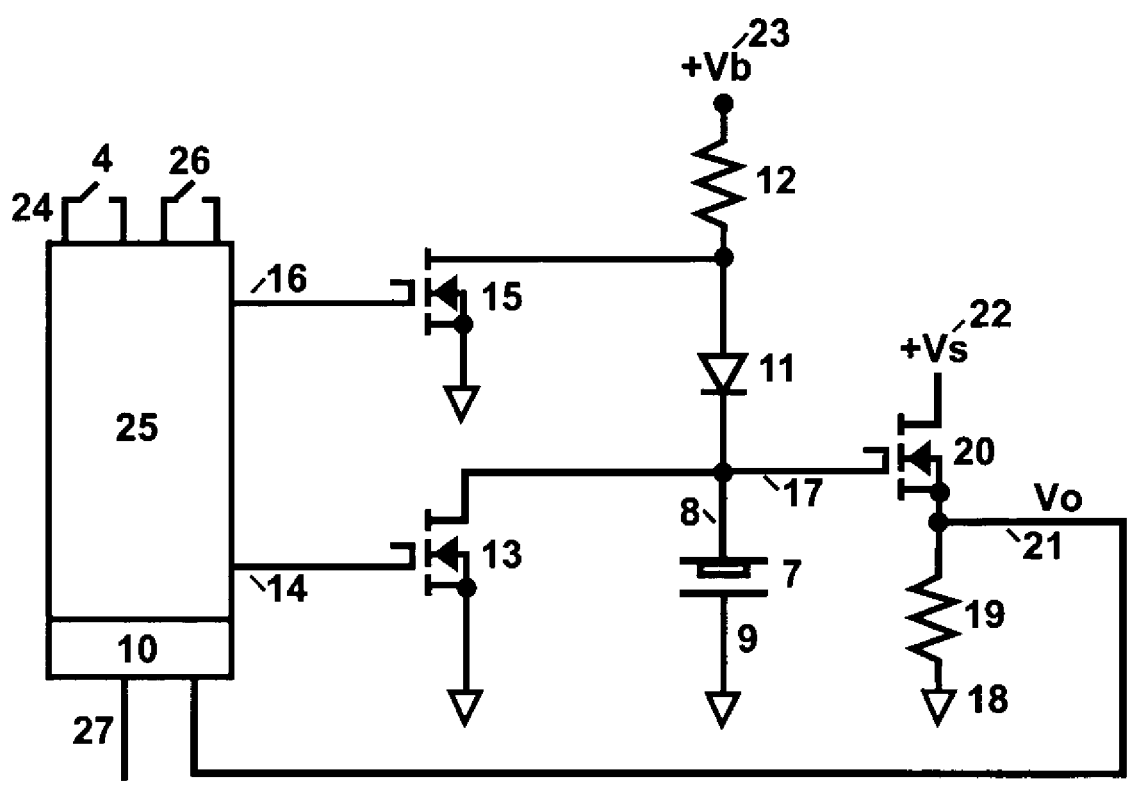

FIG. 2 details an electrical schematic of the preferred embodiment

Figure 3:
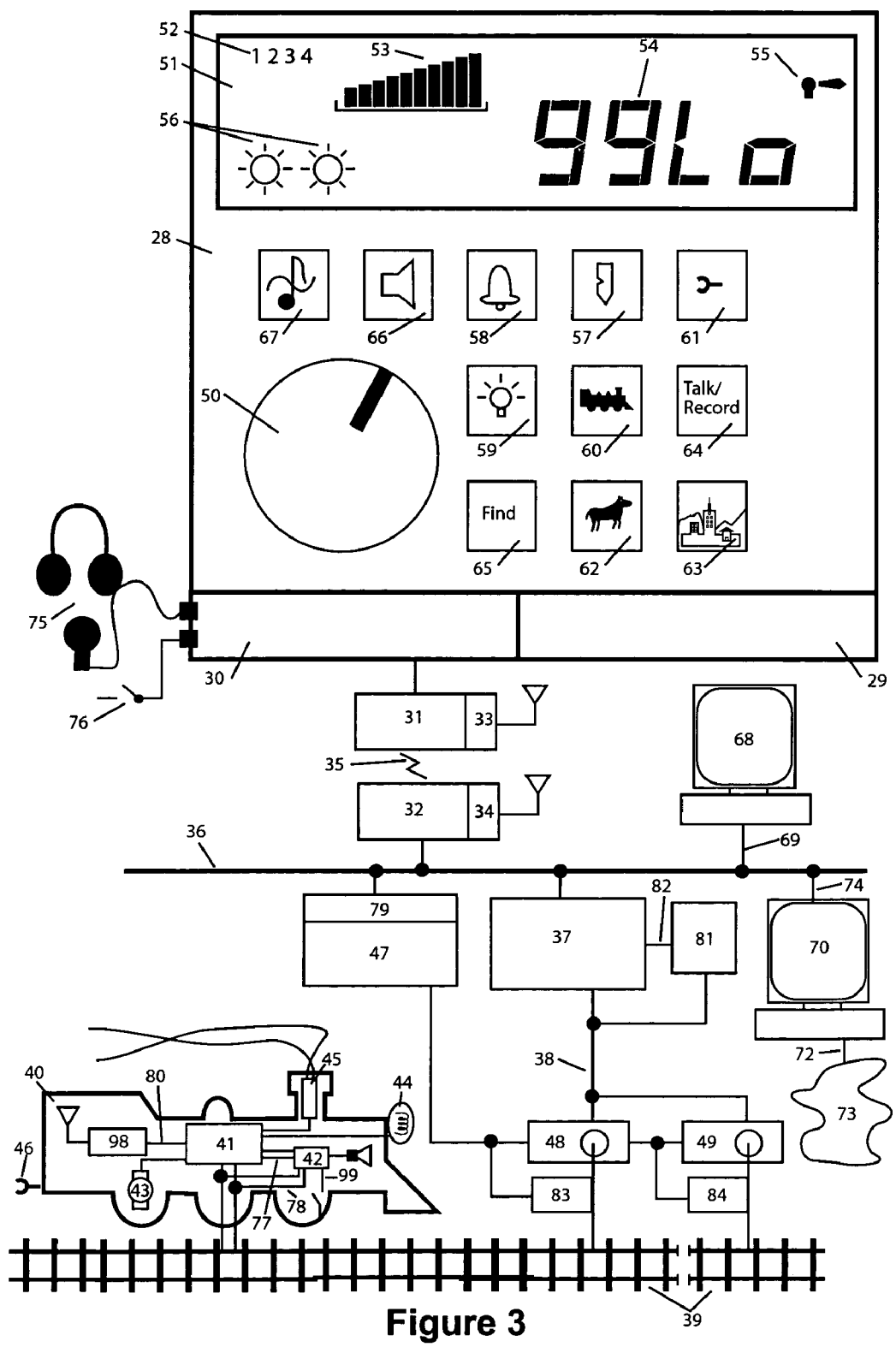
Figure 4:
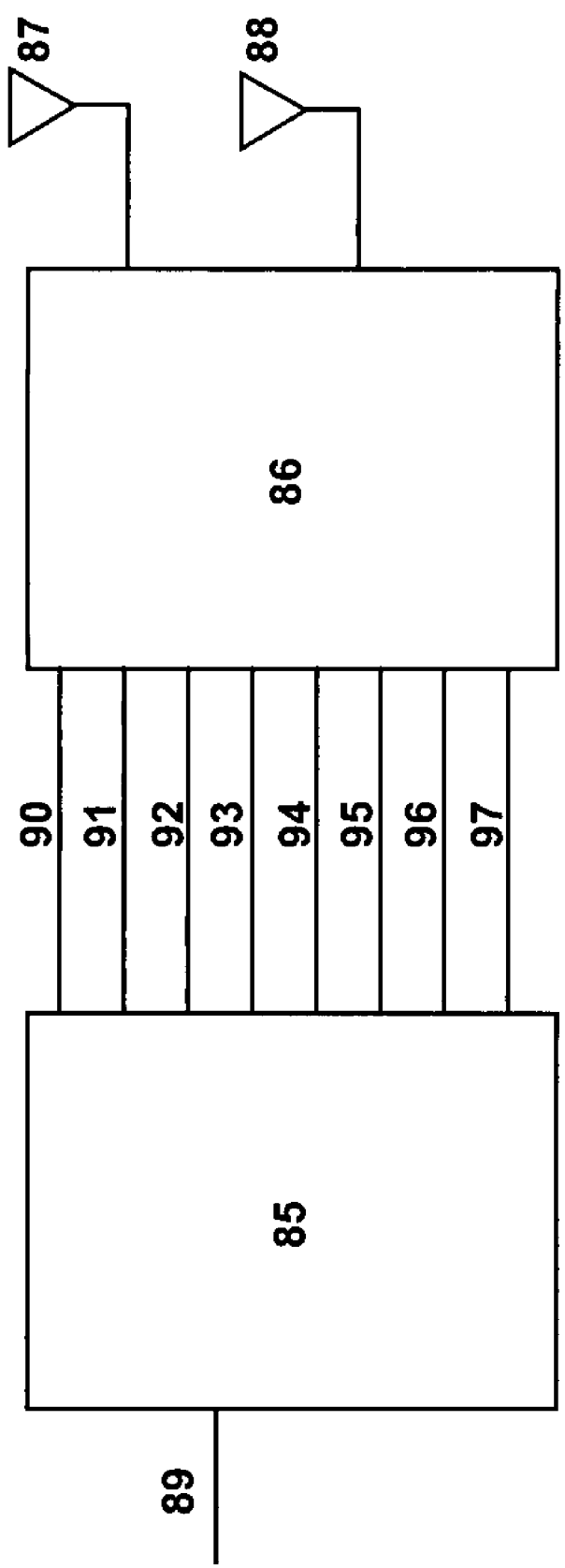
Figure 5A:
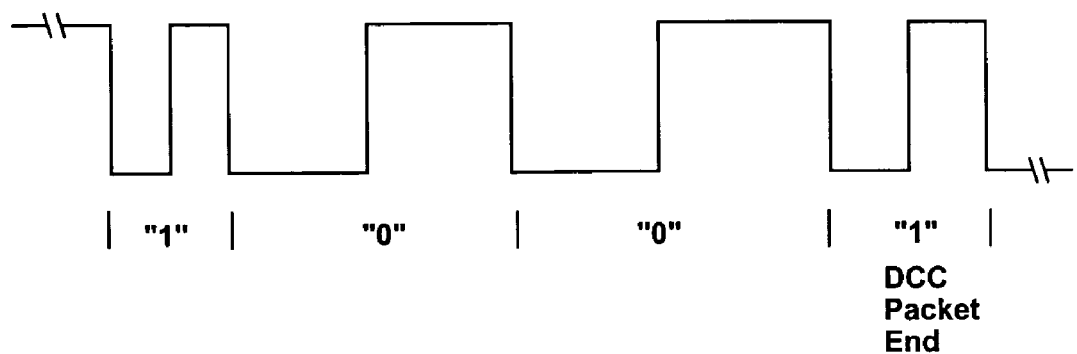
Figure 5:
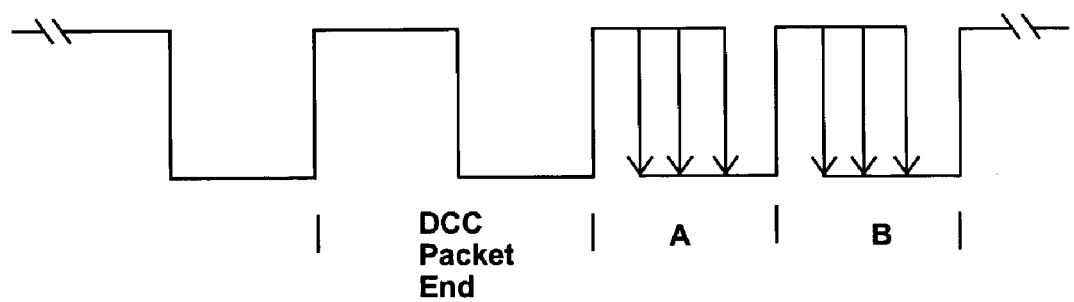
Figure 5:
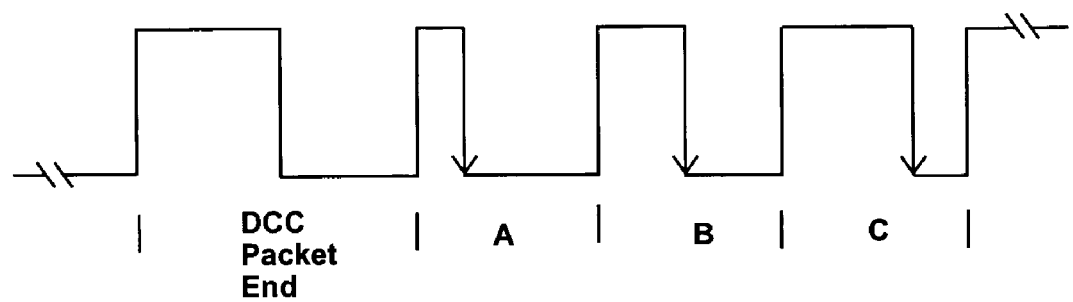

FIG. 3 details an example of a proportional user interface and system connection FIG. 4 details an improved RF transceiver embodiment FIG. 5 details an improved Track control waveform

DETAILED DESCRIPTION OF INVENTION

Proportional Key Construction

FIG. 1 depicts the key elements of the physical arrangement of the preferred embodiment of the invention in a user input device, or throttle, for a digital model railroad control system. Item 1 represents the actuating finger of a human user. The arrow, item 2, shows the direction of the force applied by the actuating finger and the resultant arrow pointing direction is considered the Z direction axis. Item 3 is the key element that is touched by the finger, 1, and the associated electrical contact switching part of the key is shown as 4. A minimum force is required to actuate item 4 to provide an actuation signal on connection 24 and, while activated the applied force continues to be applied to 3 and 4 and may be increased. Items 3 and 4 are intimately related as a single key switch instance, and typically a key array has a number of these key switches arranged in the X and Y plane somewhat perpendicular to the shown Z-axis. Of course the Z-axis here is denoted as being approximately perpendicular at a key instance, but keys can themselves be placed in any axis or orientation when embodied within a product.

The key switch mounting substrate is shown as 5 and is typically a printed circuit board in the X/Y plane or some other form of substrate for key switch mounting. A substrate deflection-measuring or force sensing sensor means, 7, is attached to the substrate 5 by an force transmitting attachment material 6 in an orientation so as not to interfere with key switch action and permit force sensing. The attachment means 6 is chosen to be compatible with the substrate 5 and the sensor 7 and may be for example; an adhesive or solder or like material. Connections 8 and 9 represent the means for conducting the proportional output of sensor 7, related to force sensed, to conditioning electronics as shown in FIG. 2.

The key switch mounting substrate, 5, has a finite compliance and there is a resulting key switch mounting substrate deflection when a force is transmitted from the finger, 1, via key switch instance, 3 and 4. The substrate deflection-measuring sensor, 7, provides an electrical output when substrate deflection occurs due to key switch pressure or force.

Sensor 7 may in fact sense deflection caused by force on any actuated key switch in a group or array on its surface, and this deflection magnitude sensed is modified or scaled by the distance the key switch is from sensor 7, and the deflection characteristics of the substrate. In this discussion the deflection of the substrate and sensor is caused by the force to be measured so the terms force and deflection are used interchangeably in this context.

An important aspect of this invention is that the sensed deflection is related to or is qualified by a particular actuated key switch instance in a group. This is possible because the initial actuation of key switch 3 and 4 informs the attached control logic means 25 in FIG. 2, via connection 24, which particular key switch has been depressed. The conditioned or amplified output of sensor 7, Vo or item 21, may then be selected via input selector 10 and processed as a varying value by control logic 25 to be understood as a force value associated with the actuated key switch. Item 25 contains the logic, and possibly software, to perform the necessary processing and includes at least; a means of addressing or scanning for actuated key switches, controlling the force sensor conditioning electronics, a means such as an analog to digital converter or other data converter method to evaluate the force sensor voltages and the means to communicate proportional commands derived from key switch actions to the rest of the model railroad control system.

The outputs of control logic 25 are commands and control information resulting from the user's key switch actions that are appropriately configured for the rest of the control system and conducted to that system by a means that is not shown here. The details of the output connection means and proportional commands from 25 to the rest of the control system are adaptable to each type of control system and are not central to the operation of the key Z-axis sensitive proportional actuating capability of this invention.

In accessory function actuation usage for model railroad control, only a single key switch in the array is pressed at once, so it is possible to localize the meaning of the force sense measurements to the active key switch and do this consecutively for different key switches. When key pressure is released key switch actuation output from 4 indicates this to the control logic 25 so force measurement is ended and the key switch inactive commands may be generated to the control system.

If different groups of key switches have a single member that need to be active at the same time, then it is sensible to provide a separate instance of deflection sensor 7 for each key switch group. This allows the control logic 25 to process via input selector 10 a multiplicity of independent sensors and simultaneous key switch actuations in different groups. To minimize deflection sensor cross talk between different key switch groups it is advantageous to modify the substrate deflection characteristics to mechanically isolate force coupling between key groups. This may be simply done by cutting isolation channels or slots in the substrate between the key groups, or some similar method to isolate or modify the substrate force transmission characteristics. In this way it is possible to tailor the sense measurements to the desired key switch layout. If only a single sensor 7 is used then clearly input selector 10 devolves to selecting a single force sensor output.

The deflection sensor employed for 7 may be any one of the many well known devices that provide a proportional output related to strain or deflection coupled to them, such as piezoelectric strain sensors, resistive strain gauges, capacitive force sensors, inductive force sensors, conductive foam force sensors, conductive rubber force sensors and force sensors based on conductive plastic materials. To avoid the complex and sensitive electronic conditioning required for conventional resistive strain gauges, it is advantageous to employ a high output piezoelectric crystal device as a force or deflection sensor in this invention. Piezoelectric devices are conventionally employed as sound transducers, both for generation and reception of acoustic energy, as solid state accelerometers and as pickup sensors for gramophone records. These devices are inexpensive and are readily configurable for an unconventional use in this invention and have the advantage of having high sensitivity and output as a force sensor.

Some throttle devices benefit from, and strive for, a compact design so as to be easy to hold in the hand. The usage of a piezoelectric sensor in this invention also permits the valuable dual-usage of the sensor 7 as a both a force sensor and as an acoustic generator for aural feedback. This novel dual-usage capability of the invention allows for cost and space savings, since a separate sound generator is not required.

FIG. 2 is a preferred embodiment of the electrical arrangement, or schematic, of the invention. Force or deflection sensing piezoelectric element 7 is coupled by connections 8 and 9 to the conditioning electronics sense node 17 and reference or ground node 18. The output of the piezoelectric sensor is a high impedance, so buffer transistor 20 is employed so that output voltage, Vo, developed across resistor 19 and on link 21 is isolated and does not load sensor 7. The buffer transistor 20 is shown as an insulated gate n-channel MOSFET device, but a bipolar transistor or a high input impedance analog amplifier could also perform this function. The buffer transistor is powered from a supply voltage Vs, item 22, that is chosen to provide an appropriate voltage range to be routed by connection 21 and input selector 10 and then to control logic 25.

A piezoelectric crystal develops voltages when the crystal lattice undergoes deformation and these are picked up on conductive electrodes on the surface. Since the crystals are essentially insulating in nature this voltage appears to be very high impedance or electrostatic in nature. Because of surface contamination or defects in the crystal, a static deflection will result in the deformation-induced voltages decaying slowly in time. This means that the crystal output voltage will typically decay slowly over several seconds or appear to have low frequency cut-off or DC output drift.

To overcome this problem this invention employs an electrical precharge or voltage bias Vb, item 23, on the piezoelectric sensor 7. Low reverse leakage diode 11 and resistor 12 are employed to precharge sensor 7 to the bias supply Vb, item 23. When the associated key switch 4 actuation scanned by control logic 25 indicates that sensor 7 is required to be sensing Z-axis force, then control line 16 from control logic 25 is asserted to make transistor 15 conducting. This has the effect of isolating the bias voltage Vb from sensor 7 through a now reverse biased low-leakage diode 11. The voltage developed by 7 from sensing substrate deflection is configured in polarity for the finger force direction, 2, shown in FIG. 1 to be opposite in polarity from the positive bias voltage Vb. This means that an increasing force sense voltage will be negative across the precharged sensor 7 and will act to lower the voltage on connections 8 and 9 in proportion to the applied force. This lowered voltage is at sense node 17 and is then buffered by 20 to the rest of the electronics. The control logic 25 acts to correctly sequence the control needed to scan the switches 4 and measure and interpret the varying voltage derived from sensor 7.

If control logic 25 determines that key 4 as been actuated for a long enough period to permit a predefined amount of sensor voltage decay, then it may perform another precharge of the sensor, 7, and still continue operation. Subsequent precharges may be correctly accounted for by noting that the finger force cannot vary much within the typical millisecond period used for a precharge of 7. Thus the measured voltage values before and after the precharge must effectively represent the same force, so the control logic 25 can correctly associate these two measurements in a continuous manner and present an output measurement that has been compensated or corrected for sensor voltage decay. This correction process of the invention overcomes the limitations of the piezoelectric sensor by effectively providing for a DC level restoration and steady voltage output from an inherently unstable DC drifting sensor.

Control line 14 is employed to control low output-leakage transistor 13 to create a sound output when the sensor 7 is not being used for force measurement. When not measuring force, transistor 15 is non-conducting which allows precharge of sensor 7 via 11 and 12. In this state a sequence of timed on and off conduction periods of transistor 13 will create a sympathetic varying voltage, swinging from approximately zero volts to Vb, across sensor 7. The value of Vb has been chosen to be sufficient for this AC voltage to provide an acoustic or sound output from sensor 7. The conduction periods of 13 and timing are chosen to provide a suitable tone and duration of the sound or beep. The coupling of sensor 7 to the substrate by 6 ensures that when acting as a sound transducer the sound energy is effectively conducted into the substrate and environment of the throttle unit.

The preferred embodiment shown in FIG. 2 is not intended to limit the means of implementing the essence of this invention. There are numerous circuit arrangements that can perform the processing steps and overall function of this invention and still employ the concepts shown herein. The usage of the proportional commands generated by this invention is not intended to be limited solely to whistle pitch control.

In FIG. 2 the value of Vb is typically chosen to be in the range of +8 to +16 volts DC. This provides a sufficient voltage for sounds to be generated by typical piezoelectric devices such as a disc element in the range of 3 mm to 45 mm. The schematic of FIG. 2 is specifically crafted in a manner so minimum supply current is consumed when no key actuation or sound generation is occurring.

Since the piezoelectric element has effectively bilateral transformation characteristics, a given output force or deflection will result for a set input voltage as a transducer and vice-versa as a sensor. Thus the voltage range for sensing and sound generation can be configured for good performance with inexpensive control electronics.

Accordingly the circuit of FIG. 2 may be easily configured with an appropriate piezoelectric sensor to operate with a single logic driver device that incorporates a high-impedance third operating state or tri-state output. In this way, a tri-state gate operating in its normal driven high and low state can connect to leads 8 and 9 of sensor 7 and drive it with a sound generating square wave of the amplitude of its logic supply, for example +5 volts for a CMOS logic device. Driving the logic output high also performs the precharge function and then immediately switching the logic output to the high-impedance or ti-state level then permits force sensing. The sense node 17 is still buffered by 20 or any other equivalent high impedance amplifier. If the proportional output voltage of sensor 7 is too low, then the buffer device 20 may also be reconfigured with additional components to provide any needed voltage amplification as well as high impedance buffering.

Note that with this configuration it is also possible for the precharge to operate by driving the terminals 8 and 9 to a zero volt level with a logic output low level. In this case the sensor connections 8 and 9 are reversed so that an applied force creates a positive voltage at node 17. Here control logic 25 can measure the force voltage directly referenced to ground and does not need to subtract the offset of the bias voltage Vb.

In addition to the alternate use of logic gate devices noted, logic controlled low-leakage analog bilateral switch devices may be employed by anyone skilled in the art of analog electronics design to generate the precharge voltages and sound-generating voltages, as performed by devices 13 and 15 in FIG. 2. These same analog bilateral switches may also be employed in the input selector 10 to perform the voltage selection or multiplexer function. If input selector 10 has low leakage and high input impedance suitable for the sensor employed, then the buffer stage 20 and 19 may be eliminated and sense node 17 may be coupled by connection 21 directly into 10. These variations may be useful to cost-reduce the electronics needed when a multiplicity of force sensors are used to create more than a single proportional control key.

With an array of piezoelectric sensors in different groups of key switches it may not be necessary for all sensors to generate sound. In this case only the pre-charge and buffer capability are needed for units that do not make sound. In this configuration input selector 10 is used to select the appropriate sensor voltage when an associated key switch is actuated. The extra conditioning electronics employed by each sensor instance is not shown here since it simply is a repeat of the electronics presented here. Extra control items performing the function of 16 and 14 for extra force sensors are likewise not shown since they are simply repeated as extra outputs from control logic 25 as needed.

Item 26 represents a second key switch actuation input associated to a second sensor unit and additional conditioning electronics with a voltage sensor output 27, connected via input selector 10 to the control logic, 25. When 26 is actuated, control logic 25 selects the associated sense voltage via input selector 10 and can time-share and sequence its processing capabilities amongst a multiplicity of force sensors to provide multiple proportional control keys.

If a multiplicity of key switches is to be associated with a single force sensor, 7, then it is advantageous to calibrate the force coupling strength of each key switch so that all key switch pressures may be equalized in the proportional control values sent to the layout control system. This may be performed at manufacture by applying calibrated forces to each key switch in turn and having the control logic 25 measure the force voltages generated, calculate appropriate calibration constants that allow force measurement normalized to the reference forces, and then save these in a non-volatile memory. These calibration constants are fairly repeatable for units manufactured with reasonable tolerances, so the calibration performed on a reference unit may usually applied to other units manufactured in the same process. In this manner the required accuracy and control range may be obtained from the force sensing key switches.

A novel possibility is to build the key switch array purely with force sensing switch elements. In this variation we merge the key switch actuating function, 4, with the force measurement function, 7, in each key instance into single outputs that are conditioned and then selected by input selector means 10 and processed by the control logic, 25. A key actuation decision is made by a force threshold decision means within control logic by setting a threshold force level to signify initial key action. Subsequent forces above the threshold level then are interpreted to be proportional control inputs. The invention methodology applies the same procedures for proportional command generation with this key construction method. It is possible to still generate sound, and a precharge cycle may also be employed if a suitable transducer is employed. Mechanical isolation may not be needed on the key mount substrate since the force sensors in this arrangement are only coupled to the switch they are used to measure forces on.

Preferred Embodiment within a Layout Control System

FIG. 3 shows an example of the preferred embodiment of proportional control keys in a manual input device (or throttle), 28, that is connected via data interfaces, items 31 and 32, to a bi-directional system data network, 36, and then to a Command Station, 37, to form the basis of a layout control system that this invention upgrades in capability to proportional control.

An encoded square-wave digital track control waveform formed by the track output (or booster section) of Command Station, 37, is carried by track connection 38 to the train tracks, 39, and then to a locomotive, 40, which is on a track section that has been electrically separated, as needed to allow track occupancy detection and/or bi-directional data transponding detection capability with the layout detection system, 47.

For a proportional control capability, the system must now be configured or adapted to allow distinct new proportional commands generated through a device such as a computer or PC, 68 or throttle, 28, to be communicated over the network, 36, using new network proportional commands specifically assigned for this purpose. Further, the Command Station must now be able to parse or decode any network proportional commands and then address and encode these into the appropriate track control waveforms for distribution to the targeted decoder device on the layout.

A new throttle or input device message must be created that allows: (1) the selection of the address or identification of the targeted decoder device and the type of waveform encoding to be used to encode the resulting proportional command, (2) an identifier for the proportional channel to be controlled, (3) the actual proportional data to convey and (4) error control and other information to ensure proper delivery of the message in the layout control system.

Since the Command Station, 37, may be capable of sequentially interspersing different types of encoded track control waveforms, for example the Digitrax DCS100 Command Station has allowed mixed DCC and Marklin Trinary operations since 1995, this is why it must also be possible to choose the track coding to be used for encoding this proportional command. Since there are many choices for track control waveforms that may be employed with this invention, a decoder device on the track such as 41 must also be configured to detect, decode and process the appropriate proportional commands encoded on the track waveform and then convert the implied action to a proportional effect or an aspect of an effect.

There has not been a reduction to practice of a fully proportional control capability before this invention, so the track encoding used by the Command Station and understood by a decoder device may be chosen in any convenient and compatible manner for implementation.

Thus, the addition of proportional capability to a layout control system has far reaching effects and burdens on many system elements. For this reason the commands and system elements must be designed and then upgraded carefully within the guidelines noted here for proportional control to be successfully implemented. The nature and control capability of the system is dramatically modified once a proportional capable input device such as a throttle is added, but a lot of prior changes must be implemented in the underlying system to allow this proportional expansion to be possible. Thus the proportional upgrades to the system are a prerequisite new capability and are latent until actively used by an input device that allows the initiation or generation of an actual proportional command. Usage of a standard non-proportional user input devices on a layout control system that has the new proportional capability does not invoke or enable proportional control.

Items 48 and 49 represent detection components coupled to track connection 38 that allow detection of occupancy and/or transponding (bi-directional) data from the multiple tracks, 39, to be derived from the track control waveform voltages and currents for the layout detection system, 47. A tracking buffer/filter, 79, is employed within the logic of the layout detection system, 47, to ensure occupancy detection and transponder tracking and feedback data is filtered, stabilized and more reliable in the face of track noise and loss of pickup etc. This tracking buffer/filter, 79, provides a data source to the network that can be interrogated even whilst the underlying detection decisions are being processed. The tracking buffer/filter employs threshold-weighted decisions based on weighted averages of detection events and hysteresis to reject perturbations in the detections, so as to present a stable detection result to the rest of the control system. An example of this layout detection system would be the art described in Ireland 6,220,552 and divisional patents, and embodied in a Digitrax BDL16 detector device. Note that the occupancy and transponding data detection and layout feedback can occur on non-DCC digital track waveforms and even on DC powered layouts.

Item 41 represents a decoder device mounted in the locomotive, 40, that connects electrically to the tracks, 39, to get power and commands and controls; a motor, 43, lights, 44, electric uncoupler, 46, and a smoke generator, 45.

An additional expansion of external sound generator, 42, is connected by function control lines, 77, to the decoder and may powered from the tracks by connection, 78, as an alternative to getting power from the decoder. An expansion RF transceiver module, 98, is connected by an expansion link, 80, for data exchange and control by the decoder and also can get its power via the decoder from the tracks or a battery in the train. These expansion units may be installed as desired to add new sound and control capability to the basic locomotive.

The requisite batteries and/or wall power sources to energize this layout control system are not explicitly shown here, but are understood as provided as needed to enable the system to function as described herein.

Throttle Device

Item 51 is an example of a user interface display on the throttle, 28, that can show a multiplicity of sets of alphanumeric data (54) and other status information, (52, 53 55 and 56) to the user, including but not limited to; train number and speed (optionally calibrated by user to be in mph or kph units), location of the train, programming information, motor load information, motor or decoder temperature, system status information, static function states (52), layout signal indications as seen from the train cab (55). This display can be fabricated with LED's, LCD's, EL or VF panels or any combination of display technologies. The display may alternate element usage to show different data types at different times (in different "contexts" or focii) or may have sufficient dedicated elements to show all the desired information at the same time.

Item 50 represents a speed control knob, which can be a rotary encoder or potentiometer or a slider type control or switch array or other device allowing a user to predetermine, or select, a desired speed setting. This is typically the user interface item dedicated to train speed setting. The speed control knob, 50, can also have an associated switch that allows an extra axis of hand motion, such as pressing down on the knob (a "click"), to invoke a control function such as completion of a locomotive (train) address selection process or even a multiplicity of actuations for additional controls, such as a "double click" to change locomotive (train) direction of movement.

Item 30 represents the throttle control logic that animates the throttle capabilities and creates the user interface and processes information bi-directionally from the control system. Item 29 represents the user interface logic that allows the throttle control logic, 30, to process; the key (items 57 through 67) presses and pressures, the speed control knob, 50, and the user interface display, 51. The individual wires and circuit elements inside the throttle are not shown here, since they would clutter the drawings and are not needed for one skilled in the art of electronics and user interface design to create these modules and functions from the information provided herein.

System Internetworking and Expansion

The bi-directional system data network, 36, allows all devices that co-operate to provide functionality and form the layout control system, to exchange data without the need for a central mediation for this data flow. It is the intention of the bi-directional system data network to provide network bearer that will conduct the backbone data communications transparently irrespective of the data type. For example, an instance of a PC, 68, may be attached via a link, 69, to the bi-directional system data network, 36, and/or another instance of a PC, 70, can also be connected via another link, 74, and then allow a further external data connection via item, 72, to the Internet, 73. An instance of the Internet, 73, may also be replaced by a reduced sub-set such as a Intranet.

Any PC or other network device can generate messages and emulate the functions of a manual input device or throttle, 28, and may also extend the display and control capability of a throttle, by virtue of increased resources such as a VGA LCD display, mouse etc. Any device that operates as a throttle or a throttle emulator, or that can execute control software is considered a control input means.

The item 72 external data connection can be any type of connection that allows TCP/IP or UDP protocols to be transmitted in both directions to form a connection to the Internet or a subset or any local Intranet branch, such as; 10 Mbps/100 Mbps/1 Gbps Ethernet, Wireless 802.11x/WiFi wireless access point or other data or network modem such as a DSL/Cable modem or a Telephone data modem. With broadband connections the data transmitted can be more rich than simply layout control commands and status, and now it is possible to exchange multimedia content and information throughout the layout control system extent, so for example a camera mounted on a train can be viewed remotely, or sounds and conversations can be sent via the network backbone 36, etc.

A PC, 70, may implement a layout control program such as suggested by Katzer, Dunsmuir or other software such as WinLok by DigiToys Systems Inc., and can be configured to provide remote client access to the system or throttle emulation and/or user interface display from another PC or other type of information appliance or device on the Internet.

Alternately the PC, 70, can implement a Web server interface using TCP/IP and link 72 to the Internet and provide a layout control channel via link 74 back to the layout control system. With this method the remote Internet device or information appliance may then employ any of the well-known Browser software programs that can then operate or monitor the train layout and provide a user interface display from any location with Internet access, since the Web server translates layout state and control information to graphics, symbols and text that a standard browser can interact with.

Once a TCP/IP connection is established, a remote Internet device has access to all information and data flows on the bi-directional system data network, 36. Multiple instances of 70, 74 and 72 running different software types can provide a multiplicity of different interfaces or "ports" to the Internet or other Intranets.

The backbone data network, 36, and its command grammar and access rules is a significant advantage over the Wolf single connection Master/Slave architecture, and allows multiple types of data connections and devices to operate simultaneously independently of any Command Station or TIU. An important distinction for adding a multiplicity of PC's and even a multiplicity of Internet access ports, data or multimedia channels is that the PC's are added directly to the layout network and add capability organically to the network as a whole, and not just limited to the TIU or another PC in the communication chain.

Note that PC's 68 and 70 (and throttle 28, detector 47 and any other additional system devices) are not limited in their connection and interaction to just the Command Station 37 (equivalent to Wolf's TIU), but can directly converse across the network and exchange; data, control software, control software microcode, diagnostic information, messages, graphics display data, sounds or other multi-media data to another device and not involve the Command Station at all. This ensures the layout control system is not limited by the capability and features of a central Command Station/TIU which can rapidly become a data and speed bottleneck as systems are expanded.

All data on the bi-directional system data network, 36, is broadcast and visible to all connected devices and this visibility can also be conveyed faithfully by TCP/IP data encapsulation as a network extension to any remote Internet information appliance. Even though any data is broadcast it may be directly or indirectly addressed to a recipient device and the data content, or 'payload', of any message can be any data needed to establish a link and exchange any type of data needed.

Examples of this are the ability of the PC's, 68 and 70, to send addressed PEER-to-PEER data, text and signal display messages and get key responses from a throttle(s) 28, across the network without any intermediary or Command Station (37) or its internal control software being involved. Additionally the PEER-to-PEER and other commands can be used to communicate software updates that can be addressed to any device connected and addressable directly or indirectly from the network or its extension to the Internet.

An external combination microphone and headset, 75, can be plugged into the throttle along with a "press to talk" or VOX switch, 76. The talk/record key, 64, can be used as an alternative transmit key to item 76. This then allows the user to record or send sounds, voice messages and conversations as encoded data via the bi-directional system data network, 36, as a (1) broadcast to all devices such as throttles, PC's etc or (2) private narrowcast to a specific device such as a dispatcher at a remote PC on the Internet. This means that the common radio headsets/walkie-talkies (used for communication with a dispatcher or other train engineers) can be combined with their throttle into a single convenient unit, so there are less items to carry.

Note that the piezo-electric key-pressure transducer (or other speaker) may also be added inside the throttle to act as a speaker along with a separate microphone to allow a bi-directional voice or sound link over the system, as an alternate to a headset, 75.

Since the user interface allows changing key focus and meanings as user input modes are changed, the talk/record key, 64, can also be used to signify the wish to 'record' sequences of switch commands and train controls when the throttle is in Switch (turnout) control mode, and then these "macro" sequences can then be stored in an ALM route module of Ireland '739, or any PC or other device attached to the backbone network, 36. Again these features involve elements distinct from the Command Station/TIU, 37, and the ALM or similar route and control data can be accessed and edited from anywhere on the network, and is distinct from the Wolf art. Naturally it is also possible to allow selective read-only and/or copy protection of the database content available on the network.

The user interface display features configurable alphanumeric text areas and icon displays close to input keys, so it is advantageous to allow the formation and control of "soft keys" in the interface in addition to any fixed function keys. These soft keys change focus with the change of control functions and modes and are a concise way of adding numerous additional proportional key capabilities without requiring excessive additional dedicated keys. The keys 61, 57, 58, 66 and 67 are closest to the display and these can be used in conjunction with display message choices to provide a context modifiable key input capability. Alternately these five mentioned keys can be moved and replaced with extra-unmarked keys with meanings set by the adjacent display messages.

The user of the throttle, 28, can also execute a FIND command key, 65, to obtain the latest transponding position information directly from the layout detection system, 47, so it can immediately display and update of the position of the train that it is presently controlling (or focused on) from a tracking buffer/filter, 79, embodied in item 47.

Note that all the detection information such as Transponding position and DC block occupancy information that can be generated by the layout detection system, 47, is immediately and continuously broadcast on any change detected, over the network, 36, without the intervention of the Command Station 37.

With this architecture it is possible to configure the layout detection system, 47, to be used on a DC layout without the need for the Command Station, 37, (or equivalent TIU) so the network approach, as embodied for example in the widely used Digitrax LocoNet, provides a very flexible and improved control strategy, different to the art and architecture of Wolf.

A further example would be the interconnection via LocoNet of a Digitrax SE8 signaling system with a BDL16 occupancy detector to a DC layout that can then be configured to provide integrated signal control and turnout control using a throttle and a PC, without a Command Station or any square-wave type control signal on the tracks.

The initial use of the FIND key, 65, for a selected decoder address or train alerts the throttle control logic, 30, that the user interface display, 51, should now additionally display position information along with; the train number, speed and other displayed state information, and then subsequently track and display the changing position information as it is broadcast over the system. Since the invocation of the FIND that triggers the position display in the throttle can be asynchronous to the ongoing detection process, and the throttle may not have been following the position information, the initial actuation of the FIND will cause the throttle to also request the current stable detection information directly and only a copy of this information from the tracking buffer/filter embodied in detection system, 47. This is only done to ensure correct synchronization of display information. This action is incorrectly interpreted in Ames' 292, and in fact the FIND key does not initiate a location inquire packet to the decoder, and the system is already tracking this decoder before the FIND can be used on the throttle.

The Digitrax BDL16, and successive detection devices are also capable of other bi-directional data feedback methods as stated earlier. For example Operations Mode Programming readback of CV's is possible, so a user throttle (or PC) can read back decoder operational information such as back-emf settings (Digitrax CV55 to CV57) and error/diagnostic information (CV30) while the decoder is moving on the layout. In particular CV30 has flag/status bits to indicate motor overload, function lead problems and other status information and these can be viewed diagnostically from any device that is in communication with the layout control system. The present back-emf voltage settings (conveying load), motor current, function lead current, distance traveled and input line states can also be determined from a remote location, even the Internet.

Note that sections; 5.2, 10.1, 10.3, 16.2 and 16.3 of the "Digitrax Big Book of DCC" teach that the (bi-directional) feedback data from a detector like the BDL16 can be used by numerous types of devices (including PC's) in communication with the system and can be configured to; be used to display layout states, allow modification of layout behavior and automated control.

Using detection, position and bi-directional data feedback, expanded control capability along with enhanced worldwide Internet broad-band communications, it is realistic for a remote application such as the program "Trainz" or other simulator software, such as Microsoft "Train Simulator" to allow remote operation of layouts in cooperation with local manual operation layout engineers and dispatchers that provide full sound, vision and status display to all participants. This would provide a mixture of a "virtual reality" train layout(s) and operations merged with some "real reality" layout aspects. This combined layout configuration with the addition of proportional control capability, further enhances the modeling realism, accuracy, controllability and enjoyment.

Untethered Data Links

Items 31 and 32 implement the data connection between the throttle, 28, and the bi-directional system data network 36, and may also link to RF transceivers 33 or 34. This data connection may be via a tethered or hardwired connector arrangement, for example by RJ12 style Telco jacks and plugs, that allows the bi-directional exchange of data, symbolized as item 35, from the throttle to the system via wire connections. Throttles can configure to an untethered mode employing an Infra Red or RF wireless link that is automatically enabled when a direct tethered (wired) link between 31 and 32 is detected by the throttle as disconnected or inoperative.

Item 33 shows an RF transceiver that can communicate with another RF transceiver, 34, attached to the network interface, 32, and able to operate as a proxy data connection to the bi-directional system data network, 36, and allow the throttle via 31 to have full bi-directional data access as if it were tethered.

Note that in instances where data response back to the throttle can be selectively ignored, a lower cost one-way (simplex) IR or RF link can be employed by the throttle in sequential combination with tethered operations for a lower cost and power consumption untethered link capability.

To allow operation of a multiplicity of untethered throttles (and/or PC's) on a layout control system, it is advantageous to use a time diversity or burst-message scheme such as Time Division Multiplex (TDM) to allow many short duty cycle messages to share the bandwidth and available time on a single RF frequency. Additionally the burst-packets employ an address header to identify a unique layout ID (as routing information) that the message is addressed to. The preferred implementation of the RF link is a FM modulated frequency agile transmitter and/or receiver, although other methods may be employed. The FM carrier modulation method offers the advantage of the well known "FM capture" effect, due to the non-linear addition of in-band IF 'noise', to allow multiple transmitters on the same frequency to effectively send interference-free at the same time to the closest FM receiver. Additionally, multiple instances of item 32 and 34 combined as RF connections can be added to different parts of the bi-directional system data network, 36, and can co-operate efficiently via the network architecture to provide a distributed coverage area that is greater than that of a single instance of 32 and 34 in combination with any untethered throttle. This then is an example of an RF data link engineered for space diversity. An AM or OOK modulation based system cannot create this type of stable space diversity. Note too that co-operating pairs of instances of 32 and 34 can also be used to extend the backbone network, 36, wirelessly and transparently to other areas with the same ID.

Using this space diversity and TDM combination it is possible for a multiplicity of separate ID layouts (e.g. modular layouts at a train show) to operate with many throttles each in the same building at the same time. For example, at the 1999 NMRA Train Show there were up to 7 separate Digitrax radio equipped layouts, each with 4 to 10 throttles, operating within an approximate 40,000 square foot floor plan at 916.500 MHz, with no reported reception problems or interactions.

Improved RF Data Link

A preferred embodiment for item 35 data exchange (and even links 69 and 74) is a bi-directional or duplex untethered link. To further expand the number of throttles that can operate in an area, it is useful to employ a frequency agile transceiver, so the systems can employ frequency diversity (i.e. different RF frequencies or channels) to expand capacity and avoid interference. Allocating a single frequency for each layout to share for all its throttles is a possible strategy, and each throttle transceiver can scan the RF spectrum to find a particular fixed channel with a matching or desired system ID to then operate with. However, since there are variable sources of man-made interference on e.g. the 900 MHz ISM bands, this is not the optimal strategy to use with an RF transceiver that is frequency agile.

An optimal operating strategy for maximum throttle and layout numbers in the face of possible RF interference is to employ a pseudo-random ordered list of hopping frequencies, or a time-variable frequency diversity. In a hopping codeset system all transceivers recognize a fundamental time period for dwelling on each of the channels before stepping to the next frequency in the codeset in synchrony. This dwell time is a key characteristic for each system, is usually tracked as accurately as the frequencies being used and is configured by a master beacon signal for each system. The master beacon information and timing can be derived by monitoring and decoding the RF emissions and can also be obtained by direct connection to the system network and directly interrogating any instance of a transceiver device such as 34 via data connection 32 and the network 36.

A well-designed hopping system allows for code hops to be lost to likely interference, but that the system can detect a data loss or corruption and allow acknowledgment handshakes and/or repetition to detect lost hops, and repeats corrupted data reliably.

Here the different layouts employ a different pseudo-random ordered list of consecutive frequency channels, or a time-offset version of that list that is another orthogonal code-set in itself. In this way, all the systems can optimally use the available bandwidth and be protected from a non-correlated or static noise emitter in the band. If FM modulation is used for the link modulation each hop, this provides another measure of link robustness and also allows the traffic density to be increased by space diversity.

A further benefit of this frequency agile strategy is that a codeset hopping RF transceiver can also scan the spectrum and detect, by recognizing the modulation and data encoding technique seen, that an older fixed frequency link is in operation and has a desired system ID to connect with. It can then change its modulation and encoding method and data rate to be in harmony with this, and then fix its RF frequency to establish a connection or link on this system with a fixed frequency or legacy RF data link. This is a valuable capability that now allows interoperation of new higher capacity and capability technology RF data links with older equipment, and that preserves the earlier investments and operations. AM modulation may also be employed alternatively to FM as the modulation method for establishing a data link to a non-hopping system.

FIG. 4 shows the configuration of a preferred embodiment for an RF transceiver. Item 86 represents an RF module that is capable of transmitting and receiving RF data. The RF control sequencing logic, 85, can be configured to connect via link 89 directly to the bi-directional system data network, 36, or alternately to a data connection like 31 or 32 or a directly to a decoder, as link 80. The particular mode of usage of link 89 is detected by RF control sequencing logic, 85, and it configures its RF operations to match the requirements for the type of link needed. This mode detection can be by coded logic states of interconnect pins or special initialization codes sent over link 89. The link 89 is in fact a plurality of control lines and signals and can exchange bi-directional data as well as control and configuration signals, such as desired RF modes as well as system ID etc.

The transmit antenna, 87, is shown as distinct from the receiver antenna 88, but in fact it is most common and preferred to use a single antenna for both functions with the appropriate RF signal duplexing or other transmit/receive separation methods. RF modules 33, 34 and 98 are shown with a single antenna. With most duplex RF links a separate simultaneous transmit and receive frequency allocation is used, but it is preferred to use Time Division Duplex at a higher bit rate to effectively create a simultaneously bi-directional RF link in this embodiment.

To provide frequency agility for the transmitter in RF module 86, connection 90 is provided for the RF control sequencing logic, 85, to setup and tune the desired transmit frequency. Item 91 controls the RF transmitter output power or AM amplitude and 92 controls the FM data modulation. These three control links allow the transmitter to be sequenced in carrier frequency, and data from 85 to be modulated in FM or AM modes. If direct sequence transmit operation is desired, then line 93 is configured to mix the transmit RF with a PRBS spreading sequence also generated by 85.

The receive frequency for data reception can be commanded by line 94, and the recovered FM data and AM (or RSSI) data are conveyed by lines 95 and 96 to 85 for processing and decoding. Line 97 is provided to control the receiver logic and gain control for AGC action. Note that each of the control lines shown may in fact be implemented with one or more signal wires, and some of these line functions may also be merged in multiplexed control lines to the real component interfaces for equivalent embodiments.

The mode selected in 85 determines how the RF module 86 is controlled and sequenced. It is most effective to employ a dedicated control logic for the RF control sequencing logic, 85, that is a microprocessor with a plurality of algorithms coded for transmitting and receiving e.g. FM modulated frequency hopping method, fixed frequency FM and AM and even a direct sequence codec.

The data sent to, received and recovered by 85 via the RF module 86 is error checked and formatted as needed, and then is available via 89 to other devices connected. In this way the complexities of the RF link operating scheme are hidden from the rest of the system by a now consistent data interface, and a single transceiver design can be more easily used in multiple ways around the layout control system to provide improved data communication and still allow connection to older or less capable RF links. The intention of the RF link is to provide a wireless bearer that will conduct the backbone data communications transparently irrespective of the data type. The preferred embodiment employs 25 to 64 hop channels in the 900 MHz ISM band, though other bands e.g. 2.4 GHz may be employed and would be considered equivalent to this method.

Note that each throttle may be a member of a frequency hopping codeset (i.e. channel) and that it is also now possible for a throttle to depart from a primary hop sequence and then employ another secondary orthogonal codeset to establish direct private communication with one or more different devices. For example, throttle 28 can change its tracked primary codeset to establish a secondary direct bi-directional RF control channel from transceiver 33 to transceiver 98 in locomotive 40, then the throttle may regain the primary codeset (since the starting timing and hop sequence is known exactly) and re-establish the primary channel via 34 to the layout control system. Upon return to the primary codeset, at whatever actual hop is active, the throttle can also now ask for re-transmission if any data was held for it while it was active (and not acknowledging) on another secondary channel directly controlling a train, sending voice, video or sound data, etc.

If train 40 is situated on tracks that have no power it may have a backup battery to allow RF control and motion, without need for a Command Station and/or booster providing track power. Additionally the train decoder 41 can be configured to allow a RF control link from a throttle or other device via transceiver 98 to be used in preference to any track communicated commands, so the track signal merely provides power, and battery recharging capability if a rechargeable battery is used. This configuration is useful alternate mode for selected parts of layouts where it is problematic to provide sufficient track power over long distances or keep the track clean enough for reliable operation.

With a digital control system, most of the data is low density and directed from the throttles or control devices into the layout control system. If status monitoring of the layout state is desired more information is then needed to be sent back to the e.g. throttles. In most cases the data can be buffered and stored and forwarded as is convenient. If the data link is expanded to multimedia then the timing becomes more critical to maintain data flow requirements and extra capacity through extra channels is useful to avoid bottlenecks. Note that throttle to throttle, and PC or Internet conversations or data exchange to a throttle are also possible.

With this novel multi-way frequency hopping control strategy, a throttle or other device can dynamically and transparently move and link to other secondary channels to exchange; direct train control, voice messages and conversations or multimedia information or other data, as needed and not interfere with basic control operations on the primary hopping sequence of the main layout system or ID. If all the secondary orthogonal codesets employ the same precise hop duration and hop in close synchrony, then a multiplicity of secondary channels are available for other control, conversations, multimedia data exchange and the like without causing interference. Since the hopping method allows many co-operating transceivers to be in simultaneous use it is also possible to extend the bi-directional system data network 36, using the primary hop or secondary hop channel/sequence to another remote instance of a bi-directional system data network to allow parts of a layout with the same system ID to be expanded without wires.

Any general RF interference to a hop is handled with standard error detecting and recovery techniques to maintain all hops to optimum capability.

Expanded Proportional Control Embodiments

From the earlier description it is possible to construct a proportional key to act as the whistle key, item 57, for a selected or addressed decoder device, and this will provide both an on/off function capability along with a z-axis pressure sensitive proportional actuation capability for e.g. a playable whistle feature.

It is useful for the bell key, 58, and a diesel idle key, 60, to have a proportional capability as well. In all prior art systems these effects have a binary function key associated with the feature. For example the Digitrax DT400 throttle predefines; the F3, like item 61, or general purpose function-3 key command and the corresponding F3 control line in the decoder for control of an uncoupling mechanism such as a Marklin "Telex", Lionel or Roco remote electric uncoupler.

It is also possible to enable a pulse-timing feature on the function lead in the decoder device to guard against the user allowing a general purpose function key (on/off type) assigned to coupler control being left on and damaging the uncoupling mechanism. Since the function keys might not have a visual indication of their present operation state, icons showing the binary state of the function keys (whether on/off) are provided as item 52 in the display.

A user may re-map any function key, and its characteristics, to any output line in the decoder by setting the throttle configuration options, or programming a similar control mechanism in the decoder.

The proportional key actuation and ensuing command disclosed to this point offers a continuously variable change, increasing and decreasing by pressure, after the threshold force has been reached from the rest point.

A very useful improvement in capability is to allow any proportional command or signal level to be latched or frozen at a non-resting value and then allow the proportional key to be released, while the proportional command value is held fixed (or even allowed to return to the reset state at a another predetermined rate).

This would allow for example the diesel idle key, 60, that is operative when the speed control knob, 50, commands a zero (or stopped) speed, to prototypically 'rev up the diesel' without requiring train motion, and then be left e.g. at a high-idle rate.

To do this we can introduce an on/off pitch (frequency) select key, 67, that (1) when on allows the any other proportional function key to be enabled to track proportional commands and (2) when changing to off, that last proportional state is frozen. This example of the associating the key 67 with pitch select and providing other types of select keys, allows a multiplicity of aspects to be made proportional for each discrete effect controlled by any function key. Naturally a corresponding unique proportional command must be uniquely defined for each type of proportional effect and aspect (or channel) that is needed, though the mapping of these commands to a particular effect aspect in the decoder device can be done at the users' convenience. E.g. the pitch key can control the speed aspect of a function.

Another binary on/off select key like 66 for volume (intensity) may also be used in combination with the diesel idle key, 60, to modify and hold the volume of the stationary diesel and then separately, the pitch or effective engine speed can be independently controlled by the alternate combination of pitch select key, 67, and the diesel idle key, 60. Naturally the sound generator can use an additional local decision logic on the variable/proportional pitch channel information to additionally modify the diesel engine volume to track when the engine sound is "revved up", but a separate volume channel can additionally adjust the absolute engine volume. The bell key, 58, can have its tone (pitch), volume and even cyclic ringing rate easily predetermined with appropriate binary select keys used as described here.

The display indicators, 56, are provided so the throttle can indicate, by being lit or flashing etc., which select key is in operation and encode how it is being interpreted by the control system, i.e. its mode of operation. It is useful to also have an indication of the present proportional value being commanded, since it may be hard for some users to distinguish fine gradations of force, or they may not be able to gauge the change of effect since the decoder device may not be within view, etc. Display item 53 is one of many methods of providing such feedback to the user visually. In this case 53 is configured as a "bar graph", similar to the well known "vu meter", and this provides an indication of the present proportional value. Many types of display, indicators, meters etc. can be adapted to provide this "analog" representation in the user interface that allows a user to confidently view and set a desired proportional value without needing to be able to directly sense the effect being controlled, and these would be considered as falling within the spirit of this invention. If a text area is available on the display, it is also useful for this to optionally flash up an additional message indicating when a function effect or aspect is being selected and proportionally modified. The display and its control by the throttle control logic, 30, is an important an integral part of the user interface.

The pitch and volume and other select keys are effectively "verb" keys to signify which aspect of the proportional effect to control, and the function keys are "noun" keys to define, select or focus on which effect or aspect is being modified. Each effect generator or decoder can then be configured to use any of a multiplicity of verb keys as simultaneous proportional control channels for a multiplicity of aspects, in any manner that allows maximum control capability.

This control of a multiplicity of proportional aspects of a function or effect is not limited to sound effects. For example the light key, 59, can be used in conjunction with the volume select key, 66, to set any brightness of lamps on the train (or passenger car). A flashing lamp such as a MARS light can use the pitch select key, 67, to adjust the frequency or speed of the flashes as well as volume select key, 66, for the light intensity, and these settings can be left at any desired values. The city sounds key, 63, can have the pitch select key, 67, select the phase of the day to play i.e. whether it is time for the morning rush hour, lunch time or evening sounds to be played, and the city lighting can track this to provide the correct ambient effect. Here the volume key would select the city noises volume and a decoder address would be allocated to the decoder device and sound module controlling these effects in each city. The countryside noise key, 62, can also have its volume controlled and e.g. the numbers of cow moos or sheep bleats per unit time and their density can be controlled to give a sense that the herds or flocks are changing over the day, as well as phasing to change from day to night sounds like crickets etc. The steam locomotive electric Dynamo speed (turbine whine) and exhaust noise level vary by load, and these aspects can now be proportionally controlled and left at a desired level. Note that 2 or more binary keys may also be employed to predetermine which aspect is to be modified by a separate proportional key, and this requires more finger dexterity.

We now can use any combination of 2 or more keys, at least one of which has proportional capability, to form a proportional control channel that can be latched or left at a state that is not the rest-state. If the extra binary select key is not used then any proportional function key simply acts as a standard proportional key that returns to the rest-state value when released. This provides a very flexible, novel and multi-dimensional control capability for a multiplicity of aspects for a plurality of addressable functions and associated effects.

Minimizing Number of Proportional Keys Required

Note that you can make either of the select or function keys proportional and the other keys simply binary, and just modify the sequence to allow this new latching capability for that configuration. It may be beneficial to minimize the number of force sensing keys to lower cost.

For example as an alternative embodiment, if keys 66 and 67 are now configured to be proportional then we can have the function keys 57, 58, 59, 60, 61, 62 and 63 be less complex (and costly) binary (on/off) function control keys. In this manner a proportional volume key, 66, in combination with binary key 61 can control the loudness of the coupler clank activation, and a proportional pitch key 67 in combination with 61 would control another coupler proportional aspect like how many discrete clank events would occur, as being proportional to the train length.

The sequence of activations between a proportional key and a function key can also be used for expanding the control repertoire, such as a double click of the function key can enable another aspect of the function to selected, much like a shift mode, e.g. a double-click of the bell key would allow the pitch key to now control the bell ring rate instead of bell pitch/tone/timbre. A proportional select key, 66 or 67, operated without a function key could control a basic key aspect such as overall decoder volume or pitch for proportional Doppler simulation for the decoder address selected.

Note that prior art sound decoders such as those by ESU allow sound volume, some pitch ranges and variations in sound effects, and control flags for these, to be selected by CV programming defined by NMRA RP-9.2.3. These CV adjustments may be used in conjunction to fully proportional control taught here, but are relatively clumsy and not as comprehensive and accessible as real proportional control.

In summary, by using a proportional key in time sequenced combination with one, or more, other binary key(s) it is possible to expand proportional control to selection of different control aspects of a function or effect and allow the latching of this proportional value. The important action is the use of multiple keys in combination and sequence.

Although the train speed controlled by knob 50 is defined as not being a proportional effect in this invention, it is possible to use this as a proportional (verb key) input in combination with some function keys. Since the speed control is considered as always active for a selected decoder while it is possible to change a function state, this multiple use is awkward but can be achieved by using another sequence or other key to change the speed knob, 50, usage to allow a proportional capability. For example if the light key 59 is held down and then the speed knob, 50, is pressed down to enable its switch, then a proportional lamp brightness command can be generated by turning the speed knob while it is pressed down. Release of key 59 or the speed knob switch would end the proportional light command, and the speed knob can revert back to train control. Using an encoder for the speed knob sensor makes reversion to prior train speed easiest. Note that if the speed knob is not pressed down then the light key 59 reverts back to binary function control of the light using the last brightness setting.

Proportional Effect Creation and Filtering

A fully proportional control by a key can be quite sensitive to the amount of key deflection (depending on mechanical compliance) and even with an analog readout of the present proportional control value it may be too "twitchy" for persons with poor fine-motor skills or hand-eye coordination. It is useful to be able to subject the proportional command to a filtering effect prior to its being transmitted to the system. A good example of this would be low-pass filtering of the key proportional/variable force information after the force threshold is exceeded. If this key variable force data is now fed through an electronic integration process (equivalent to low-pass filtering), for example in software or equivalent, it is possible to have a perceived desensitization of the key action, since now the proportional commands are the result of the summation of key force over time and seem to be acting more slowly. The integration rate (sensitivity) can be adjusted from no effect (high speed/ standard response) to a very slow effect (maximum integration/filtering). In this way rapid key changes can be smoothed out and the user feels an extended response is possible by adding the dimension of the duration of key actuation along with key force to the proportional control. An excessively slow integration effect will limit the possible rate of change the user can obtain. The amount of raw proportional force in fact controls the slope or the rate of change of the integration process.

In fact with this novel configuration a binary function key using a filtering method would provide a proportional control capability without the need for a force sensor. This is unlike the Marklin playable whistle control with a binary function key varied in actuation time, mentioned earlier, since the key press and following filtering and control logic actually develops a controllable and varying proportional command value that then is the input to the control system and then to the track, whereas the Marklin sound generator creates a variable pitch whistle in response to a timed binary command from the track.

On a real layout, as happens in the prototype, as a train moves around an area it is expected that the echoes and reverberation will change. An aspect of a proportional command channel is a good choice to allow the onboard sound generator to modify a simulated reverberation capability. If location detection is employed then it is useful for this proportional reverberation effect channel to be monitored and automatically controlled by a device on the layout control system.

In the real world, that we wish to emulate with the closest realism, a true Doppler effect and its rate of change is proportional to the vector speed of the train (relative to the speed of sound) and position of this source (train) relative to the observer's position. Thus the Doppler shift needs to be adjusted for the correct pitch, amplitude and rate of change and timing for the user position in 3 dimensions relative to the layout and the actual train. The pitch rate of change is directly affected by the varied geometry of the observer's position, so the Wolf simulation is limited and can at best only be accurate for one layout position and command initiation time. Incidentally, this well-known Doppler rate of change phenomena is used in satellite position measuring systems such as; the Iridium and Orbcomm satellite telephone systems, the old US Navy "Transit" SatNav and the more modern Cospas-Sarsat emergency beacon system.

The Wolf Doppler simulation method only allows one control degree of freedom, and this is the start time of the effect that is controlled by the user interface. Note that this Doppler effect is simulated, since it is not created by the physical velocity of the moving model train, but a predistortion of the character of the sound emitted by it, since the model moves very slowly compared to the speed of sound. In fact, it cannot accurately be termed a "Doppler" effect since its limitations do not fully model the real world. It is more properly defined as a predetermined variable pitch effect.

Employing the superior proportional control channel capability of this invention, the user now has multiple degrees of freedom and can thus realistically increase pitch and volume by an adjustable and desired amount and rate of change for an a approaching train when it is appropriate, and then conversely reduce these effects as the train recedes. This type of multiple degrees of freedom control is fundamentally and clearly different and superior to the single degree of freedom approach of the prior art, which cannot fully implement an accurate Doppler effect simulation for the observers. The new method is able to correctly and accurately model the real Doppler effect as it would be observed by an operator at different locations, and thus is distinct from the effect claimed by Wolf and also discussed by Severson.

A decoder device is typically a small portable electronic module that employs hardware and/or software to detect and execute commands from the track control waveform. This type of decoder function is not limited to small devices connected to the tracks and in fact can be programmed into, for example a PC or specialized processor running surround sound capability with a signal interface to intercept the track control waveform, or a connection to the bi-directional multiple-access data network to directly receive any proportional commands broadcast.

Expanded Track Control Signals

Prior art such as the Digitrax DCS100 Command Station allow the interleaving or interspersing of DCC and Marklin Trinary control signals to expand the control capability and increase the types of decoder devices and trains that can be run on a layout. Now it is possible to allow decoders to automatically detect and select one of a multiplicity of track encoding methods and operate with it. A further useful expansion is add a new interspersed encoding with a significantly higher data throughput to allow larger numbers of trains to operate with reduced latencies or delays and allow other types of digital data to be sent via the tracks such as programming, sound or multimedia information.

FIG. 5A show a prior art DCC waveform example. At the left side the first encoded "1" data bit is shown as a low period half-cell followed by a high period half-cell. The half-cell period of a DCC "1" is typically 58 microseconds, so it takes a track cycle of 116 microseconds to encode a "1" data bit. Scanning to the left is then a "0" data bit with 2 half-cells of 116 microseconds and then another "0" data with the last high level half-cell of an zero-stretched value to provide DC offset for legacy train control. Finally a "1" bit is depicted that is intended to be a "packet end" bit of a DCC packet, and after this DCC packet completion and even some extra "1" bits it is possible to transition to a different track encoding method, such as Marklin Trinary.

The DCC timing provides a square-wave track waveform with a low effective frequency to mitigate RFI concerns but is limited to a fastest data rate of "1" bits taking 116 microseconds. This is limiting for a large number of trains or if it is desired to send multimedia sound, data etc.

FIG. 5B shows and improved encoding waveform that can be used for format expansion and is compatible with existing track boosters and decoders. Here the waveform is shown starting with a DCC packet end "1" bit and then transitioning into an "A" cell. This "A" cell is shown with 3 alternate widths, by the 3 downward arrows so that each discrete width possible for the "A" cell can encode 1 of 3 possible code values. The following "B" cell also is shown with 3 possible widths, so this cell can also encode 3 possible values. If the "A" and "B" cells were 58 microseconds each then the combination of pulse widths of these 2 cells would encode 2 sets of 3 choices each, versus just 1 choice for a DCC "1" bit, which yields a big improvement in data throughput on the same track infrastructure. The new encoding is effectively a phase encoding where the start edge of a cell is at a fixed repetition time, and the harmonic content is dictated by the phase variations employed. By choosing a sensible repetition frequency and limiting the minimum pulse width, it is possible to control the RFI to acceptable levels with a square-wave track signal. Note that it is not possible to employ more advanced phase encodings such as QPSK or Trellis codes without modifying the track signal and boosters to allow more complex multiple voltage levels, and this would not then be compatible with existing DCC Command Stations or track signal boosters. It is also not possible to provide legacy DCC zero-stretch control of conventional DC trains for the duration of the improved phase-encoding.

A convenient phase-encoding example would be a 10 microsecond minimum pulses (waveform high and low times) and 16 width encodings of 2 microsecond increments, that would form a total repetition time of 52 microseconds (10+32+10=52 uS). With this example, we would encode 32 phase states or 4 binary data bits in 52 microseconds. This would be about 8 times faster than the best DCC signal. We can choose a different repetition rate, minimum pulse widths and number of phase steps to yield any system throughput and RFI performance desired.

The phase step size is chosen to allow a decoder to reliably time and discriminate the data encoding increments even when there is pulse distortion in the track waveform due to; voltage slew rates, conduction crossover discontinuities, load variations and any pulse timing distortions. To measure the pulse timing distortion, which can change by track load etc., it is useful to transmit training patterns of known values either at the start of a improved encoding packet burst, or cyclically as a calibration, which the decoder device can detect and infer the distortion and hence create an internal calibration table and algorithm to correct subsequent measured pulses for distortion.

FIG. 5C shows an example of 3 phase-encoded cells starting a phase-encoded type of packet after a DCC packet end bit that are used to allow compensation for pulse distortion. This shows first a minimum phase, then a mid-value phase encoded and finally a maximum phase encoding. Now the decoder has 3 known points to infer timing distortions and can update its internal compensation algorithms accordingly to ensure reliable detection. More than 2 points of known data to pulse width encoding and time measurement, and 3 or more are preferred, and these are pre-determined so the receiving decoder can perform the pulse distortion measuring function as needed. An excessive number of training pulses increases the coding burden and lowers the time available for channel data and does not add much improvement to data reception or accuracy.

Each cell can now phase-encode a discrete number of states, which then represent a number of binary data bits encoded. To improve reliability it is possible to trade off the bit-rate to have more complex encoding rules to detect and correct most common bit or burst errors. For example, if each cell encodes or quantizes for 16 distinct phase timings or 4 binary information bits, it is possible to use 2 cell pairs to derive 8 coded bits per pair of cells. These 8 bits can then be coded using a coding system of a chosen minimum Hamming distance of 2 to allow any 1-bit error to be corrected, and now 32 states or 5 bits are transmitted per raw 8 input bits. Higher levels of detection reliability and correction can also be employed with lower throughputs, by trading off coding entropy. Thirty-two phase increments can encode 5 binary bits, but with the need for more accurate time resolution in a decoder. The actual phase timing encoded can be mapped in any way to the input code bit patterns for each cell.

The phase-encoded waveform can be constructed as detailed here, and suitable pulse timing choices ensure that a legacy DCC or Marklin Trinary decoders will always see the interspersed phase-encoded packets as errors and reject them while still correctly operating on the interspersed packets they are designed to decode. A variable zero-stretched DCC "0" bit cell cannot be mistaken for a phase-encoded digital code cell because of its long time duration. Additionally this zero-stretched "0" bit does not actually encode any digital information but rather, allows the waveform DC balance to be controlled.

Using this improved phase-encoding method a higher speed control and communication strategy can be formed with minimal impact to existing investments in the layout control system, decoder devices and trains. The packets and commands encoded by the improved method can be formed broadly using the same methods as for DCC or Marklin formats with the addition of noted pulse distortion measuring mechanisms. The greater data throughput now allows more trains to operate on the layout, and can allow multimedia data such as real-time sound to be sent to an addressed decoder device. The Command Station, 37, can be upgraded to selectively form these phase-encoded packets as needed along with other square-wave signals.

A further improvement is the control capability of the system is to allow the Command Station, 37, to be expanded in multi-format track waveform control signals, in addition to interspersed square-wave digital control signals like prior art mixtures of; DCC, Marklin Trinary, Trix and FMZ formats etc.

Since the square-wave track signal generators and track drive booster outputs are band-limited to ensure RFI compliance with e.g. FCC and CE requirements, it is possible to add compliant AC-coupled low level RF signals, encoded for digital commands into the square-wave track signal to establish other control links. Item 81 represents a module that can create an RF digital command signal from data conveyed over the connection 82 from the Command Station, 37. Connection 82 can also link directly to the network, 36, as an alternate arrangement. The output of the RF digital command signal generator, 82, is then combined at track connection 38 with output of Command Station, 37, to form a new expanded mixed track signal.

This is unlike the Keith Gutierrez CTC-16/CTC-2000 art, and is distinctly different from the Wolf '681 art because the "power signal" now is a separate digitally encoded waveform that is itself capable of simultaneously digitally controlling a multiplicity of different address trains with all control aspects, whereas the AC and DC "power" of Wolf has limited control aspects aimed mainly at legacy trains.

The early 1990's Lahti "Dynatrol" system and the Keller "Onboard" system both used low frequency RF analog control waveforms (or non-audio tones) impressed on a DC power signal. There were limited attempts in 1994 to put the Keller waveforms on a DCC signal to allow legacy interoperability, but the underlying RF modulation was analog in nature and limited and not of the sophistication of a digital control capability.

So, one or more encoded RF digital command signals added to a square-wave digital control signal represent an expansion of control capability. In particular multiple RF digital command signals or channels can be implemented with different carrier frequencies and channels, hopping carrier frequencies or even a direct sequence spread spectrum method. In this way a decoder that understands an RF digital command signal format that operates on an AC or DC powered layout can also be compatible with a square-wave based system, such as DCC, and can then be inter-operated with greater flexibility by using this novel configuration.

The track RF digital control signal now is conducted by the track system as opposed to being radiated through the air from a throttle or other emitter, but the decoder can automatically detect and use an RF signal by either route if it is of sufficient strength to be detected.

Note that a frequency hopping system may be advantageous here, since they are simpler and lower cost than direct-sequence spread-spectrum and any propagation, multipath or reflection problems are strongly related to frequency. Here the hopping system can dynamically search for and track a good reply from a decoder device to establish a good hop channel and preferentially employ these many possible good hops. This allows a system to inherently avoid rail RF transmission problems such as those noted earlier by Besoughloff. It is also possible to easily configure a multiplicity of separate outgoing RF digital commands to cooperate so they do not interfere with other RF signals on the tracks such as live video and sounds from cameras onboard the trains, or other multimedia signals etc.

The actual form of RF modulation or encoding of digital commands can follow prior art examples used for establishing a RF communication channel in a noisy and fading channel environment. There are 4 important features that must be included in the RF digital signal: (1) a synchronization burst to mark the start of a message in the RF channel (and to allow AGC or clock recovery action), (2) an address or routing part that allows an addressed device on any layout to determine the correct recipient, (3) a command part that encodes commands and data required for execution of these and (4) an error detection capability (that can include error recovery, such as ECC or Fire codes etc) to ensure a valid message reception.

These features map easily into a fixed frequency or frequency hopping based RF digital signal and these can use any of the well known modulation schemes such as FM, AM, Phase Modulation, BPSK, QPSK, Gaussian MSK etc.

For a direct-sequence spread spectrum type RF signal the clock recovery and data/error recovery are well known demodulation capabilities of this technique, [e.g, as taught in "The ARRL Spread Spectrum Sourcebook" ISBN 0-87259-317-7, published 1990], but the addition of a error detection coding separately over the digital message and the use of AGC provides and improved reliability. A direct sequence method allows a coding gain that de-correlates other PRBS coding keys and noise so as to provide co-channel capability in the same spectrum, but then practically requires all other similar power emitters to use this more complex link scheme to avoid interference or noise encroachment.

A direct sequence system can be either continuous-mode or discontinuous mode of transmission. It is also possible to use the square-wave edges or identifiable transitions of the underlying control or power signal to provide a fast locking timing reference point to speed up the clock-recovery and cell boundary correlation if a non-continuous transmission direct-sequence modulation method is in use. This timing point allows the RF decoder to make pre-determined assumptions about the timing and phase of the following direct sequence fragment so that a full correlation window search of clock rate, phase and data cell timing is not required and synchrony can be greatly accelerated.

Expanded Detection Capability

With an RF digital control waveform imposed on a square-wave control signal, or even an AC or DC power signal, it becomes problematic to track and detect feedback from a train decoder device to localize position, because RF signals are notoriously sensitive to conductor paths for propagation.

To localize a responding decoder device it is possible to discriminate the particular track section and associated detection sensor the addressed decoder device is on. For an encoded current pulse reply items 48 and 49 are configured to detect the reply with prior art types of current detectors and methods.

If the reply is coded as an RF signal then it is harder to reliably localize which sensor any RF reply current is passing through. To solve this problem directional couplers 83 and 84 are added to sense the RF currents in the individual track feeds and sections, and the measured data is returned to the detection system, 47, that has an RF detection capability added. The directional coupler allows the relative strength of both the current (a) to the track and (b) from the track (reply) to be measured, so it is possible to know when a reply as RF current, is coming from a track section.

Depending on the RF frequency in use a common implementation of the directional coupler is a closely coupled set of transmission line segments. Alternatively, if the frequency is below about 20 MHz, then it is better to use a discrete component hybrid transformer (or bridge) approach to discriminate the currents to or from the track. Since there may be multiple emitters in a track section using a direct-sequence reply method, it is desirable to turn off the RF reply during the known reply period for all but the addressed decoder device, although the reply channel which has RF current from the track can be decoded to determine which emitters are actually present. Decoding multiple replies can be affected by the VSWR or track reflections, which can cause problems. For a frequency hopping RF system the discontinuous nature of the signals allows the RF replies to be easily discriminated. Once replies can be localized then it is a simple matter to use prior art to from a bi-directional data link that allows position detection.

Expanded Decoder Capability

A synchronous data connection configured from at least two existing general purpose function leads such as item 77 of FIG. 3, when connected to an external expansion module, such as a sound generator, 42 (shown with a speaker), provides a new capability to a decoder device. The addition of a proportional control command in the repertoire of commands exchanged over this synchronous data connection allows an expansion device to be added at the convenience of the user, at a point when the extra cost and capability are justified.

Since the sound EEPROM or FLASH memory, control and readout logic and the A/D conversion method (i.e. conversion of digital sounds codes to a signal appropriate to be conducted to a speaker), and external amplifier needed for sound capability represent a dominant and real cost, and take up volume in a module, it is efficient to not burden or bloat a compact decoder device with this capability.

The addition of this sound (or other expansion) feature to the decoder installation is then as simple as plugging the sound generator, 42, into the decoder, 41, and then configuring the appropriate decoder general purpose function leads, 77, to change mode to support the synchronous data link. At least two lines are needed, a clock line and a data line to create a clocked or synchronous data link where the data is valid and sampled at a predefined clock transition. The synchronization of clocked data bits into discrete bytes out from the decoder device (or in) can be indicated by providing a recognizable pause in the clock pulse stream to demark a command start. Additional function leads may be employed to flag byte boundaries or demand attention at the interface, but these are a less efficient use of the function lead resources. A multiplicity of bytes (and even extra bits) are sent per command to allow for a command type encoding, data arguments and possible error check information. The clock and data rate are pre-determined and can be as fast as needed to provide control. The majority of operating state information across the synchronous link is directed toward the expansion unit (e.g. a sound generator) but it is possible to configure the data line for read back of acknowledgements and data if this is required.

A multiplicity of sequential commands over the synchronous data link continuously convey the current control states known in the host decoder device such as, at least; function states, throttle speed, present speed motor load, proportional channel values, control and address CV's etc., and it is beneficial for the synchronous data to be updated as a priority when any significant state change is seen. If no state changes are seen, it is possible to simply refresh all the information in sequential order until a change needs to be communicated at the next possible update period. Since the function lines changed from general-purpose use for lamps etc., are not now available for anything but the synchronous data link, these can be restored as outputs from the expansion module, e.g. sound generator, since all the function state information is sent over the synchronous link. For example, if F1 and F2 are converted to synchronous mode use, then the sound generator can recreate these lines as well. In fact on many DCC systems, F1 is commonly allocated to bell control and F2 for whistle control, so these functions in this example would be used solely for sound control and would not have a meaningful use as recreated general purpose function output lines for e.g. lamps or smoke unit etc.

Since the current motor speed and load must be calculated to be conveyed by the synchronous data link to e.g. a sound generator, this data may also be employed within the decoder to provide scalable speed stabilization to the motor. A further refinement is the modification of the speed stabilization in sympathy to the type of sound module connected and how it is configured. For example a diesel and steam unit have different droop characteristics under load, so a droop CV for scalable speed stabilization adjustment can be modified based on the sound generator. A cam timing input to the sound generator, 99, for timing e.g. a steam chuff can also be fed back into the decoder to affect the motor speed control as well as modifying the sound generation scheme.

One benefit of this arrangement of two devices is the fact that it is easier to install two smaller modules within the confined spaces of a locomotive. It is cheaper to replace or repair only one of two elements if one fails. If the sound or other expansion is not desired in a train, or is impractical due to e.g. size constraints, the decoder can beneficially use the synchronous data link leads as originally intended as direct functions controls for; lights, smoke generator, un-couplers, door opening actuators etc. The sound unit or decoder can also be changed individually to improve features at lowest cost and impact to the other unmodified unit.

The synchronous data link is also configurable to conduct commands that allow the downloading of new encoded sound and configuration data while the decoder and data link are active on the tracks, and this data can also be real-time streamed data for the speaker that is interspersed and conducted via a fast-digital track expansion format.

Note that the sound generator can also have its power leads connected to the track, by connection 78, and if this connection is detected to be in effect, automatically change to receive and decode new commands directly from the track waveform. In this case, the synchronous data link is still operative and is used to receive data from the decoder that must be synchronized to the motor state, such as; present speed and load and when the motor actually changes direction or stops which are affected by the back-emf adjustments and motor characteristics. By selectively decoding commands and data via track connection 78, the sound decoder can make use of expansion data formats of e.g. a phase-encoded expansion signal to obtain real-time sound for output or new programmed sounds to store in Flash memory or EEPROM, to add capability without possibly obsoleting the host decoder.

A steam sound chuff is effectively a variable duration pink-noise impulse of steam that transits the drive cylinders and then is acoustically filtered by the resonant cavities of the smoke box and smoke stack. This forms the chuff that is heard by an observer. Additionally there are cyclic noises from the valves, controls and steam cylinders and other items, but the predominant sound is from the smoke and steam exhaust. Instead of recording several examples of the locomotive at discrete load levels as done with prior art it is useful to model a recorded chuff or pink noise event and then modify this continuously by trainload. In particular the steam pulse timing varies over a known range and so an original long duration fixed pulse steam chuff waveform may be mathematically adapted to emulate the varying steam pulses. The attack and decay envelopes of the steam pulse change with load, but the predominant change is in width of the chaotic-flow steam pink-noise sustain envelope between these. Accordingly it is possible to selectively remove or filter sound fragments from the long sustain envelope to develop a shortened or higher rate chuff pulse. Since steam has dynamic mass and pressure effects as its flow varies, as the speed and trainload changes the volume, pitch (harmonics) and low frequency components change in an amount that can also be added to the pulse simulation. These three modifications to a representative long chuff, in a blended configuration can calculate a simulated steam chuff that is responsive to a continuously sensed speed and trainload measured from the motor load and back-emf information that is available over the synchronous data link. Since some of the sounds are from a more distant cylinder on the other side of the locomotive it is also possible to model the nearer-further cylinder amplitude effects of a compound engine from a single chuff as well.

Having thus disclosed the preferred embodiment and some alternatives to this embodiment, additional variations and applications for this invention will be apparent to those skilled in the art of decoder, layout control system and electronic design, with minimal extra effort. Therefore, while the disclosed information details the preferred embodiment of the invention, no material limitations to the scope of the claimed invention are intended and any features and alternative designs that would be obvious to one of ordinary skill in the art are considered to be incorporated herein.

Consequently, rather than being limited strictly to the features disclosed with regard to the preferred embodiment, the scope of the invention is set forth and particularly described in the following attached claims.

What is claimed:

1. A method for using proportional commands to control a train layout comprising:
   providing a proportional control input for generating a proportional signal in response to an input action;
   using a command station to process said proportional signal into a track control waveform for said train layout;
   communicating said track control waveform to said train layout;
   using a decoder to receive said track control waveform from said train layout and to decode said track control waveform to control a device for proportional effect.
2. The method of claim 1 wherein said track control waveform is a digital bipolar square-wave waveform.
3. The method of claim 2 wherein said digital bipolar square-wave waveform is a waveform selected from the group comprising: NMRA DCC, Marklin Trinary, Trix, FMZ, and Zimo.
4. The method of claims 1 or 2 wherein said proportional control input communicates to said command station with a bi-directional system data network.
5. The method of claim 4 further comprising a layout detection system for bi-directional data exchange with said decoder to allow display of data communicated via said bi-directional system data network.
6. The method of claim 4, wherein said proportional control input is a throttle means.
7. The method of claim 4, wherein said proportional control input includes a computer.
8. The method of claim 1, wherein said proportional control input is a throttle.
9. The method of claim 1, wherein said proportional control input includes a computer.
10. The method of claim 7 or 9 wherein said computer is further connected to an Internet.
11. The method of claim 1, wherein said decoder has a synchronous data connection to an expansion module.
12. The method of claim 11, wherein said expansion module controls a sound generator.
13. The method of claim 12, wherein said sound generator modifies sound pitch and volume in response to motor load and speed information.
14. The method of claim 1, wherein said decoder controls a sound generator in response to said proportional control input.
15. The method of claim 12, wherein said sound generator is controlled by said proportional control input.
16. The method of claims 12 or 14, wherein the control of said sound generator is used to simulate at least one effect from the group comprising: variable rate pitch-change Doppler effect, variable rate amplitude-change Doppler effect, sound pitch, volume, repetition rate, sound duration, echoes, reverberation, and number of events.
17. The method of claim 13, wherein said motor load and speed information varies a steam chuff.
18. The method of claim 11 further including a track power connection to said expansion module for direct decoding of track commands.
19. The method of claim 1, wherein said decoder device controls a light.
20. The method of claim 1, wherein the signal from the control input is a latched value other than at a resting state.
21. The method of claim 20, wherein said proportional control input includes at least one proportional key arranged with at least one binary key to provide a latched value.
22. The method of claim 1, wherein said proportional control input includes a multiplicity of keys and wherein said proportional control input controls a plurality of different effects.
23. The method of claim 1, wherein said proportional control input includes a multiplicity of keys with a binary key and a filter to lower the sensitivity of proportional control.
24. The method of claim 3, wherein said bi-directional system network means uses a bi-directional RF data link.
25. The method of claim 24, wherein said RF data link means uses a frequency hopping transceiver.
26. The method of claim 25, wherein said frequency hopping RF data link selects between a primary hop sequence and a secondary hop sequence.
27. The method of claim 26, wherein said secondary hop sequence is used to control said decoder.
28. The method of claim 27, further including a backup battery.
29. The method of claim 28, wherein said backup battery is charged by power from said train layout.
30. The method of claim 26 wherein said secondary hop sequence is time division multiplexed with said primary hop sequence.

31. The method of claim 26 wherein said at least one secondary hop sequence is configured to allow exchange of multimedia and voice communication simultaneously with other network data with any other RF transceiver employing a matching said secondary hop sequence.

32. The method of claim 24 wherein said RF data link uses an embedded system identifier to identify the desired layout for control and allow the routing of commands and data to the appropriately identified system.

33. The method of claim 3, further including a phase-encoded digital bipolar square-wave waveform interleaved with a waveform selected from a member of the group to provide high speed control capability.

34. The method of claim 33 wherein the decoder determines and corrects for pulse timing distortions.

35. The method of claim 33 wherein said high speed control capability allows multimedia data and programming data to be sent over the tracks to a sound generator.

36. The method of claim 12, wherein the decoder further controls a light and a motor.

37. An apparatus for generating proportional commands and for controlling devices in a train layout system, comprising:
   a control input having a proportional key for generating an input signal proportional to an input force and for outputting a digital signal;
   a bi-directional transceiver for transmitting said digital signal to
   a command station for processing the digital signal and for generating a control signal for controlling said train layout system;
   a decoder for receiving and decoding said control signal and controlling a device for proportional effect.

38. The apparatus in claim 37, wherein said bi-directional transceiver employs an RF transmitter.

39. The apparatus in claim 38, wherein said RF transmitter uses frequency hopping.

40. The apparatus in claim 37, wherein said bi-directional transceiver forms a bi-directional system data network.

41. The apparatus in claim 40, further comprising a user interface display for receiving data from said decoder via said bi-directional network and for displaying a status indicated by the data.

42. The apparatus in claim 37, wherein said control signal is a waveform selected from the group comprising: NMRA DCC, Marklin Trinary, Trix, FMZ, and Zimo.

43. The apparatus in claim 27, wherein said decoder includes a synchronous data connection to an expansion module.

44. The apparatus in claim 37, wherein said decoder controls a sound generator.

45. The apparatus in claim 37, wherein said sound generator proportionally modifies sound pitch and volume in response to motor load and speed information.

46. The apparatus in claim 37, wherein said decoder controls a proportional effect of a sound generator.

47. The apparatus in claim 37, wherein said decoder controls a proportional effect of a light.

* * * * *